(12) United States Patent
Tavassoli

(10) Patent No.: US 6,308,771 B1
(45) Date of Patent: Oct. 30, 2001

(54) HIGH PERFORMANCE FAN TAIL HEAT EXCHANGER

(75) Inventor: Bahman Tavassoli, Newton, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 0 days.

(21) Appl. No.: 09/181,598

(22) Filed: Oct. 29, 1998

(51) Int. Cl.$^7$ .................................................. H05K 7/20
(52) U.S. Cl. .................... 165/80.3; 361/704; 257/722
(58) Field of Search .................... 165/80.3, 165; 257/719, 722; 361/704, 710

(56) References Cited

U.S. PATENT DOCUMENTS

| | | | |
|---|---|---|---|
| 2,936,409 | * 5/1960 | Jackson et al. | 165/80.3 |
| 3,217,793 | * 11/1965 | Coe | 165/80.3 |
| 3,313,340 | 4/1967 | Dubin . | |
| 3,457,988 | 7/1969 | Meyerhoff et al. . | |
| 3,566,958 | * 3/1971 | Zelina | 165/80.3 |
| 3,829,740 | * 8/1974 | Beasley | 165/80.3 |
| 4,296,455 | 10/1981 | Leaycraft et al. | 361/691 |
| 4,535,384 | 8/1985 | Wakabayashi et al. | 165/80.3 |
| 4,765,397 | 8/1988 | Chrysler et al. | 165/104.33 |
| 4,953,634 | 9/1990 | Nelson et al. | 165/147 |

(List continued on next page.)

FOREIGN PATENT DOCUMENTS

| | | | |
|---|---|---|---|
| 485205 | 5/1992 | (EP) . | |
| 612105 | 8/1994 | (EP) . | |
| 623952 | 11/1994 | (EP) . | |
| 698214 | 10/1953 | (GB) | 165/185 |
| 6019048 | 12/1985 | (JP) . | |
| 1204498 | 8/1989 | (JP) | 361/702 |
| 2047895 | 2/1990 | (JP) . | |
| 4267547 | 9/1992 | (JP) | 257/722 |
| 4291750 | 10/1992 | (JP) | 257/722 |
| 1714724 | * 2/1992 | (RU) | 257/722 |

OTHER PUBLICATIONS

Lee, Seri; "How to Select a Heat Sink", from the Jun. 1995 issue of Electronics Cooling, 9 pages, reprinted from http://www.cooling-electronics.com/Resources/EC_Articles/JUN95/jun95_01.htm.*

(List continued on next page.)

*Primary Examiner*—Allen Flanigan
(74) *Attorney, Agent, or Firm*—Lieberman & Brandsdorfer, LLC

(57) ABSTRACT

A novel plate fin heat exchanger adapted for high and low velocity fluid flows for dissipating heat from a heat generating component. The heat exchanger comprises an array of fins being affixed to and in thermal communication with a thermally conductive base, wherein the fins are arranged in a fan tail configuration for minimizing flow bypass, and further providing reduced thermal resistance for fluid passing through the fin field. The fins are affixed to and in thermal communication with the base at an acute angle, such that the effective width of the array of fins exceeds the width of the base. The enlarged effective width of the fin array in comparison to conventional heat exchanger provides an increased volume for fluid flow, thereby allowing a greater volume of fluid to enter the fin field and a greater surface area of plate fins for cooling the fluid passing through the heat exchanger. In addition, the heat exchanger comprises a fin density of at least ten fins per inch or greater of base length thereby providing a narrow channel heat exchanger with a fan tail. The aspect ratio of the individual channels between the fins, as compared to parallel fins affixed perpendicular to the base through an extrusion method, generates a reduced pressure drop across the heat exchanger. Accordingly, the heat exchanger of the present invention expands the envelope of cooling performance provided by fluid flow over an array of thermally conductive plates.

15 Claims, 19 Drawing Sheets

U.S. PATENT DOCUMENTS

| | | | |
|---|---|---|---|
| 5,020,586 | | 6/1991 | Mansingh ............................ 165/80.3 |
| 5,040,596 | | 8/1991 | Terasaki et al. ..................... 165/166 |
| 5,077,601 | | 12/1991 | Hatada et al. ......................... 357/81 |
| 5,168,348 | | 12/1992 | Chu et al. ............................ 257/713 |
| 5,241,452 | | 8/1993 | Kitajo .................................. 361/718 |
| 5,304,845 | | 4/1994 | Lindquist et al. ................... 257/722 |
| 5,304,846 | | 4/1994 | Azar et al. .......................... 257/722 |
| 5,381,859 | | 1/1995 | Minakami et al. ................. 165/80.3 |
| 5,419,041 | | 5/1995 | Ozeki ................................ 29/890.03 |
| 5,437,328 | | 8/1995 | Simons ................................. 165/146 |
| 5,486,980 | | 1/1996 | Jordan et al. ........................ 361/697 |
| 5,519,938 | * | 5/1996 | Kojima et al. .................... 29/890.03 |
| 5,542,176 | | 8/1996 | Serizawa et al. ................. 29/890.03 |
| 5,558,155 | | 9/1996 | Ito ....................................... 165/80.3 |
| 5,566,749 | | 10/1996 | Jordan et al. ........................ 165/80.3 |
| 5,609,201 | | 3/1997 | Anderson et al. .................. 165/80.3 |
| 5,653,285 | | 8/1997 | Lee ....................................... 165/185 |
| 5,709,263 | | 1/1998 | Mira .................................... 165/80.3 |
| 5,758,418 | | 6/1998 | Chrysler et al. .................. 29/890.03 |
| 5,763,950 | | 6/1998 | Fujisaki et al. ..................... 165/80.3 |
| 5,927,386 | * | 7/1999 | Lin ...................................... 165/80.3 |
| 5,933,325 | * | 8/1999 | Hou ..................................... 361/704 |
| 5,937,517 | | 8/1999 | Smith ............................... 29/890.03 |
| 5,946,190 | * | 8/1999 | Patel et al. ........................... 361/700 |

OTHER PUBLICATIONS

Soule, Christopher A; "Augmentation Improves Thermal Performance of Air Cooled Heat Sinks", 5 pages, from Nov. 1996 issue of PCIM Magazine, reprinted from http://www.aavid.com/atp/articles/agmtThrmIHS/.*

AAVID Thermal Technologies Catalog, Jan. 1996, p. 113.

Thermally Engineering Extruded Heat Sink Profiles, Nov. 1996, p. 652.

Wakefield Engineering Catalog, 1996, pp. 103 and 153.

National Northeast Corporation, pp. 8, 30, 48 and 49.

Electronic '90 Hauptkatalog, Conrad Electronic, Hirschau, Germany, 1990, 494.

Author Unknown, "Non–Uniform Fin Shapes of Modules in Air–Cooled Environments", IBM Technical Disclosure Bulletin, vol. 28, No. 6, Nov. 1985.

Horvath et al., "Metal Cooling Fins for a Semiconductor Package", IBM Technical Disclosure Bulletin, vol. 26, No. 7A, Dec. 1983, pp. 3233–3234.

* cited by examiner

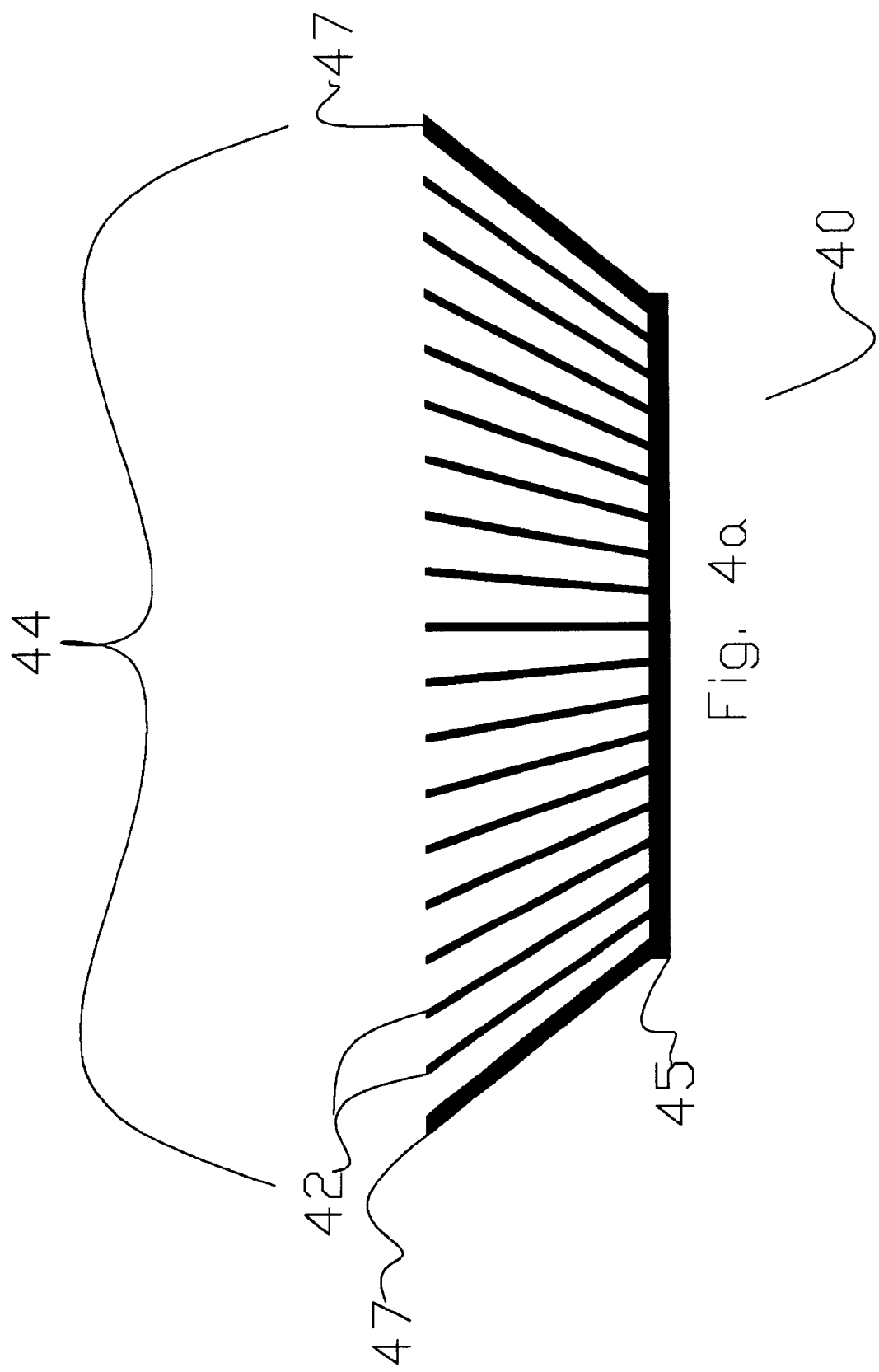

HIGH PERFORMANCE FAN TAIL HEAT EXCHANGER

BACKGROUND OF THE INVENTION

1. Field of the Invention

This invention relates to an apparatus and method of cooling a heat producing electronic component. More particularly, this invention relates to a novel configuration and design for a heat exchanger providing an apparatus and method for managing low velocity fluid flow. The invention thereby expands the envelope of cooling performance provided by fluid flow over plates.

2. Discussion of Related Art

It is important to dissipate the heat produced by electrical devices in order to extend the useful life of these devices. Heat dissipation is particularly important in the case of high-power electronic components, such as microprocessors and lasers, which generate a relatively high amount of heat in a relatively small area. Conventional heat sink devices typically utilize an array of extended surfaces, such as fins, integrally formed on a common base. The array of extended surfaces project into an ambient fluid surrounding the device. The base is placed in thermal intimate contact with a heat-producing device to provide a conduction path to the fin array. Through forced or natural convection, fluid circulation around the fin array acts as the heat transfer medium for cooling the device to an operable temperature.

Designing acceptable heat exchangers to adequately dissipate the heat generated by these heat generating components is a difficult task. These electronic components are typically used within systems housed in an enclosed cabinet having a fan mounted therein. The fan is mounted so as to pull cooling fluid across the heat generating electrical components. Given their relative simplicity, traditional extruded plate fin heat exchangers are generally preferred from both cost and implementation perspectives. Traditional plate fin heat exchangers generally offer high surface area relative to their size. However, the design of the conventional plate fin heat exchanger is often inadequate for dissipating heat generated from high power electronic components. Accordingly, conventional plate fin heat exchangers with novel design layouts for providing enhanced cooling of electronic components are a preferred apparatus for providing the proper cooling of the heat generating components.

Advances have been made involving the use of narrow channel and micro-channel plate fin heat exchangers for cooling electronic components. For example, U.S. Pat. No. 5,304,846 to Azar et al., discloses a narrow-channeled heat exchanger with certain geometric relations aimed at improving the heat dissipation of the heat exchanger. Specifically, the patent teaches optimal ratios relating the height of the plate fins to the width of the channels. The ratios may be selected for optimizing the heat dissipation capabilities of the heat exchanger for a given pressure drop across the heat exchanger.

Although narrow channel heat exchangers significantly improve heat dissipation, they, like all other plate fin designs, suffer from boundary layer formation. The boundary layer consists of hydrodynamic and thermal layers which result from friction or drag which occurs when the cooling fluid and the plate fins meet. This boundary layer of hot low velocity fluid blankets the plate fin heat exchanger insulating the exchanger from cooler fluid flow, which causes a reduction in heat transfer and premature egress of fluid from the fin field. In addition, the boundary layer narrows the remaining channel available for fluid flow and causes a reduction in the volume of the fluid flow, thereby significantly reducing the productivity of the heat exchanger. Accordingly, the conventional heat exchanger incorporating the narrow channel design continues to suffer from a lower productivity due to the formation of high pressure and a boundary layer.

The Assignee has a patent application Ser. No. 08/673, 802, now U.S. Pat. No. 5,957,194, hereby incorporate by reference, disclosing a heat exchanger comprising a fin field for reducing formation of high pressure within the fin field, increasing efficient heat transfer, and preventing premature egress of fluid from the fin field. This particular heat exchange design comprise fluid control and fluid ventilation designs for achieving a reduction in high pressure fluid within the fin field. Although the modifications disclosed in Assignee's pending application successfully reduce the formation of high pressure and fluid by-pass, such modifications to the individual fins can be costly and difficult to manufacture. In the best mode of Applicant's invention herein, Applicant overcomes the formation of high pressure and fluid by-pass through a novel design. The novel fluid control and fluid ventilation elements of U.S. Pat. No. 5,957,194 may be incorporated into Applicant's invention to further increase the performance of the heat exchanger within the parameters of the present invention, Accordingly, the present invention comprises a narrow channel fan tail heat exchanger for alleviating the inefficiencies associated with prior art conventional heat exchanger.

Therefore, what is desirable is a plate fin heat exchanger that reduces and/or deters formation of high pressure, prevents the premature egress of fluid from the fin field caused by formation of high pressure, minimizes boundary layer formation without increasing pressure, and enhances heat transfer. The present invention incorporating a fan tail design together with a narrow channel configuration overcomes the outstanding issues present in the prior art and achieves the theoretical limit of cooling performance provided by fluid flow over a plate fin heat exchanger.

SUMMARY OF THE INVENTION

It is therefore the general object of the present invention to provide a novel and improved plate fin heat exchanger for dissipating heat from an electronic heat generating component.

It is a further object of the invention to provide a novel heat exchanger adapted for optimum performance with low velocity fluid flows for expanding the envelope of cooling performance from fluid flow over plate fins. The novel design comprises a thermally conductive plate in thermal communication with the heat generating component, an array of thermally conductive plate fins affixed to the base, wherein the plate fins define a fin field having channels. The fins of the heat exchanger are designed to be affixed to the base of the heat exchanger at an acute angle relative to the base, such that the angle of the fin to the base is less than or equal to ninety degrees and the effective width of the fin array exceeds the width of the base.

It is even a further object of the invention to provide a novel heat exchanger design wherein the fins are in thermal communication with the base and affixed thereto such that the effective width of the wing span of the fins exceeds the width of the base. Commonly referred to as a fan tail, such an enlarged wing span, when compared to conventional heat exchangers, provides an increased control volume thereby allowing a greater volume of fluid flow to enter the fin field.

In yet a further embodiment of the invention, the novel heat exchanger comprises a fin density of at least ten fins per inch or greater of base length thereby providing a narrow channel heat exchanger with a fan tail. The aspect ratio of the individual channels between the fins, as compared to parallel fins affixed perpendicular to the base through an extrusion method, generates a reduced pressure drop across the heat exchanger. Accordingly, the fluid flow entering the heat exchanger is increased.

It is even a further object of the invention to provide a novel heat exchanger comprising fins with surface modifications and communication means. An increased surface area of the heat exchanger is among the benefits associated with surface modifications, such as undulations. In addition, the communication means provides for a more effective cooling of the heat generating component by the fluid passing through the heat exchanger.

In accordance with the invention, these and other objective are achieved by providing a novel heat exchanger design and configuration adapted for low velocity fluid flows. The invention thereby expands the envelope of cooling capability of fluid flow over a finned plate heat exchanger. Accordingly, the novel heat exchanger provides for a heat exchanger comprising an array of fins being affixed to and in thermal communication with a thermally conductive base, wherein the fins are arranged in a fan tail configuration for minimizing flow bypass, and further providing reduced thermal resistance for fluid passing through the fin field and a greater surface area of plate fins for cooling the heat generating component by the fluid passing through the heat exchanger.

BRIEF DESCRIPTION OF THE DRAWINGS

These and other objects, features and advantages of the invention, as well as the invention itself, will become better understood by reference to the following detailed description when considered in connection with the accompanying drawings, wherein:

FIG. 4a illustrates a front view of a preferred embodiment of the heat exchanger of the present invention;

DETAILED DESCRIPTION OF THE PREFERRED EMBODIMENTS AND BEST MODE OF THE INVENTION

In this disclosure, the term "fin" (also called a "plate" or "flat fin") refers to a substantially planar heat exchanging member that extends at an angle from a base. Such a base may support a number of plate fins, in which case, "channels" are defined as the spacing between adjacent fins. The area within and immediately about the cluster of plate fins is referred to as the "fin field." It should be understood that the term "fluid" as used herein refers to both liquids and gases. The flow of fluid across the fin field can be created using known means such as fans and natural convection.

Figure 1:
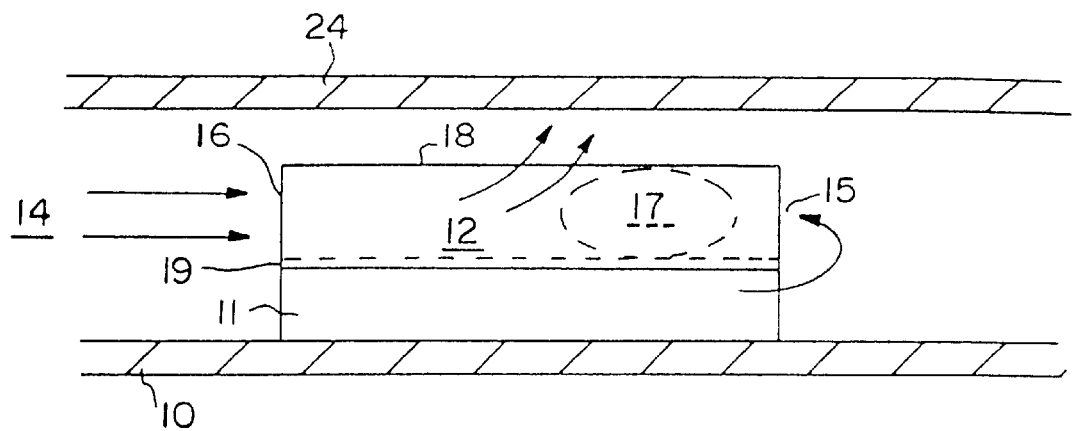
FIG. 1 illustrates a side view of a prior art heat exchanger.
Figure 2:
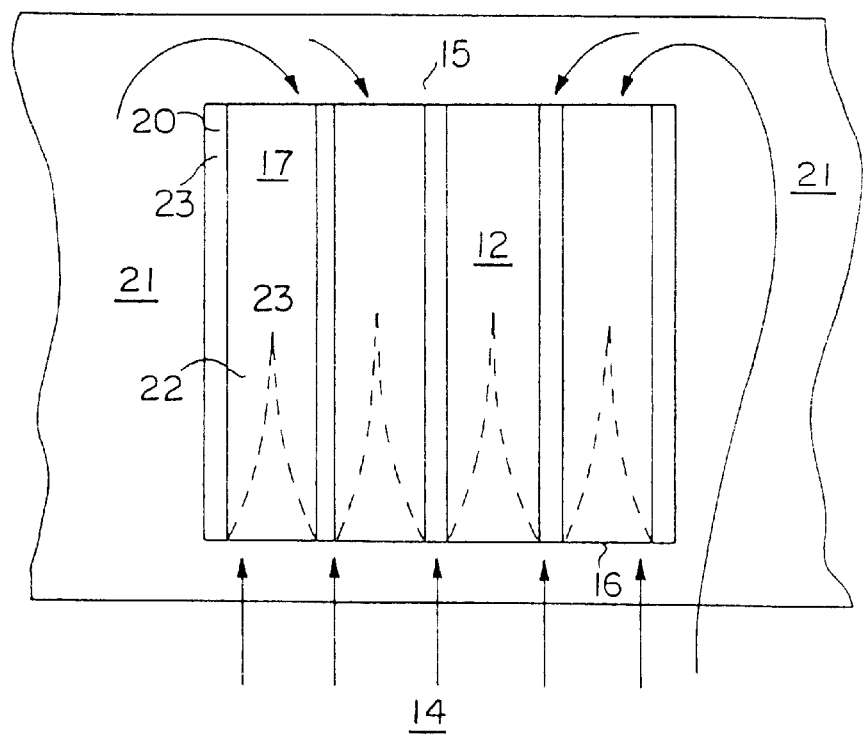
FIG. 2 illustrates a top view of the prior art heat exchanger of FIG. 1

Referring now to the drawings, FIGS. 1 and 2 illustrate a prior art configuration of a heat generating component 11 mounted to a printed circuit board (PCB) 10 and adjacent to another PCB 24. A prior art heat exchanger having individual plate fins 20 affixed to a base 19 is mounted to the component 11. The plate fins 20 define a fin field 12, and channels 23 through which cooling fluid 13 flows. The fin field 12 has a top 18, and intake and exhaust regions 16 and 15, respectively.

The combination of the heat generating component and the heat exchanger form a three dimensional protrusion into the fluid flow 14. The prior art heat exchanger, as illustrated in FIGS. 1 and 2, experiences certain fluid dynamics which reduce its effectiveness, including high pressure formation at the upstream of the heat exchanger, and premature fluid egress from the fin field.

Cooling fluid 13 entering the fin field 12 through the channels 23 forms a boundary layer 22 along the sides of the plate fins 20 as shown in FIG. 2. The boundary layer is a region of retarded fluid velocity that forms as a result of the friction between the plate fins 20 and fluid. The layer tends to blanket the plate fin thereby insulating it from the cooler fluid flow. This reduces heat transfer. Additionally, the layer narrows the remaining channel available to fluid flow which further impedes fluid flow thus compounding the problem. As shown in FIG. 2, the boundary layer 22 grows as the fluid 13 progresses down the channel, eventually contributing to a region of near stagnant high pressure fluid within the fin field.

Fluid not only penetrates the fin field 12 and forms boundary layers, but also flows over and around it. Fluid flowing over and around the fin field 12 is referred to as "flow by-pass" in this disclosure. Flow by-pass typically reduces the efficiency of the fin field 12. More specifically, fluid 21 flows around the heat exchanger 12 (see FIG. 2), turns and enters it from the exhaust region 15. This also contributes to the near stagnant, high pressure region 17 within the fin field 12. This problem is exacerbated because the by-pass fluid comprises relatively hot fluid as the fluid travels around the fin field 12 in intimate contact with the PCB. The PCB carries much of the heat generated by the components mounted thereto, consequently the passing fluid is heated as it passes the PCB. Accordingly, the increased flow by-pass accompanying the traditional design of the heat exchanger creates an increased temperature in the fluid flow surrounding the heat exchanger, thereby limiting any secondary cooling of the fluid adjacent to the PCB which otherwise may occur in the absence of a fluid by-pass.

Additionally, the high pressure caused by the flow by-pass and boundary layer formation impedes the fluid flow 13 through the fin field 12 and contributes to its premature egress through the field's top region 18. Consequently, relatively cool fluid entering through the intake region 16 of the fin field 12 is prematurely forced from the fin field. As such, the high pressure not only blankets the region in a hot layer that retards efficient heat transfer, but also forces the relatively cool fluid to leave the fin field prematurely.

Figure 3:
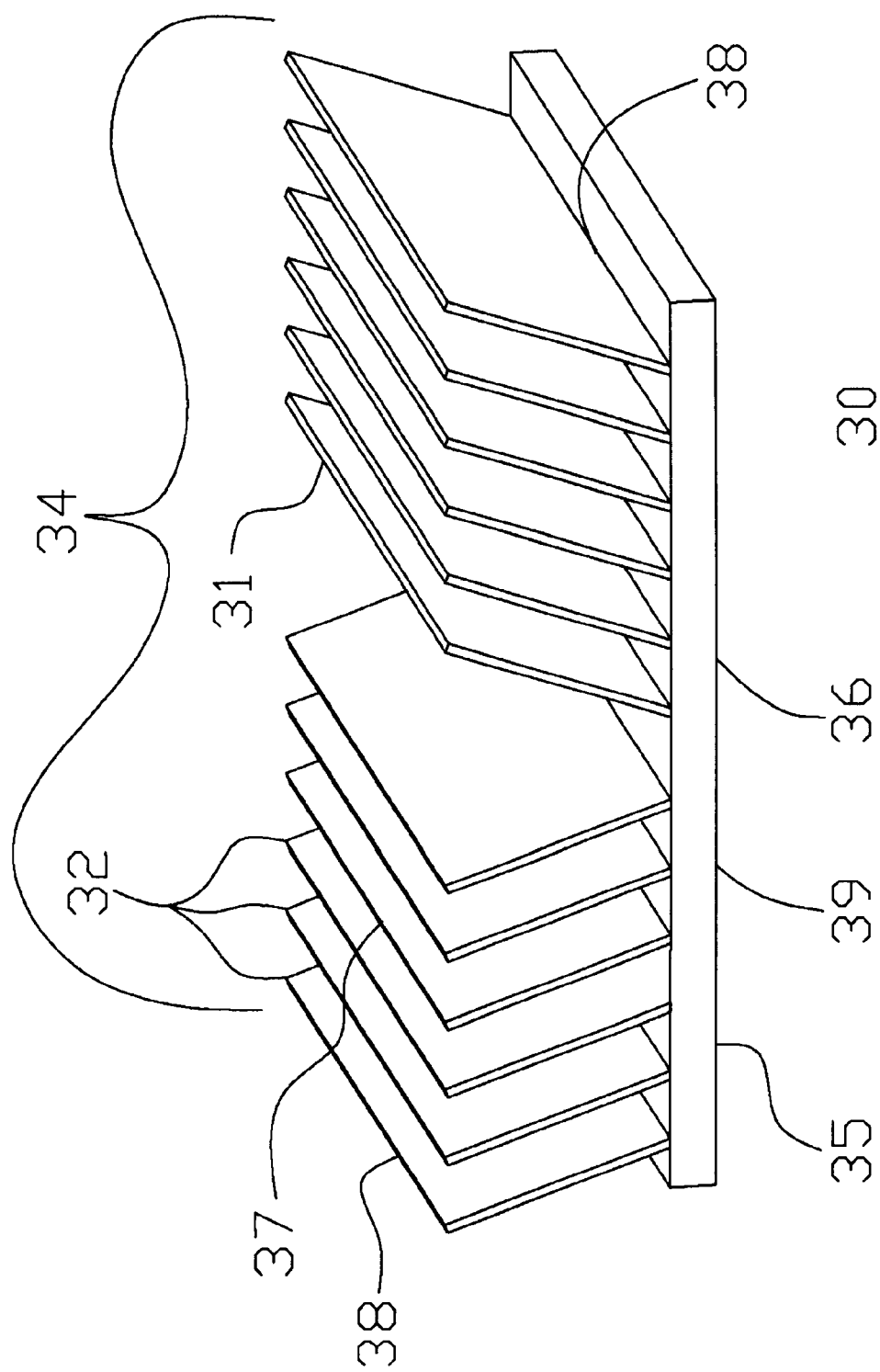
FIG. 3 illustrates a perspective view of a preferred embodiment of the heat exchanger of the present invention.

The present invention recognizes the physical attributes which cause the formation of high pressure within the fin field and its effects, as well as the formation of fluid bypass around the fin field, and provides modifications to the conventional heat exchanger as a means for providing a solution aimed at alleviating and/or mitigating these effects and providing a more efficient heat exchanger. In a preferred embodiment, the present invention provides for an improved heat exchanger 30 designed for dissipating heat from a heat generating component, such as a PCB. The heat exchanger 30 of the present invention, as illustrated in FIG. 3, comprises an array of thermally conductive plate fins 32 forming a fin field 34 and affixed to or forming a thermally conductive base 35. Within this embodiment, the width of the fin field 34 comprises a fan tail such that the span of the fins is greater than the width of the base. The plate fins define a fin field having channels 36, a top region 37, sides 38, an intake region 39 and an exhaust region 31. The thickness of the individual fins may range from about 0.1 mm to about 0.5 mm. Accordingly, the novel heat exchanger of the present invention provides for a fan tail configuration with the effective width of the heat exchanger exceeding the width of the base 35, together with an increased fin density along the width of the base to deter the formation of high pressure within the fin field, reduce the premature egress of fluid from the top region 37 of the fin field 34, minimize boundary layer formation and fluid bypass, and minimize fluid entering from the exhaust region.

Among the benefits associated with the novel design of the heat exchanger illustrated in FIG. 3 is the increase of the flow rate of the fluid passing through the fin field. By spreading the angle of the fins in the fin field, the mass flow rate of the fluid passing through the fin field increases because there is less resistance to the fluid flow. In addition, the wider flow entrance provides a larger control volume wherein more fluid may enter the fin field as compared to a conventional heat exchanger with the same or similar base geometry, fin length, and number of fins laid across and perpendicular to the base. As such, the unique configuration of the angled fins reduces the resistance on the fluid flow thereby maintaining the fluid within the fin field while allowing the fluid to pass through the fin field 34 to the exhaust region 31 of the heat exchanger 30. In addition to the fan tail configuration of the heat exchanger 30 of FIG. 3, the novel design comprises a density of at least ten fins per inch of base and may attain a density of at least as high as sixty fins per inch.

The increased density of the fins in view of conventional heat exchangers manufactured through an extrusion method in combination with the fan tail design provides a novel heat exchanger with improvements over the prior art. As illustrated in FIG. 3, the fluid enters the fin field 34 at an intake region 39 of the heat exchanger 30. Due to the configuration of the fin field 34 providing a reduced resistance to the fluid flow, the fluid egresses the fin field 34 through the exhaust region 31 of the heat exchanger 30. In addition, while the fluid is passing through the heat exchanger 30, most of the fluid is maintained in the fin field 34. By maintaining the fluid in the fin field, and egressing the fluid through the exhaust region 31 of the heat exchanger 30, both the fluid bypass as well as formation of high pressure in regions surrounding the heat exchanger are significantly reduced. Accordingly, the heat exchanger illustrated in FIG. 3 provides a novel design for a more efficient cooling process.

Figure 4B:
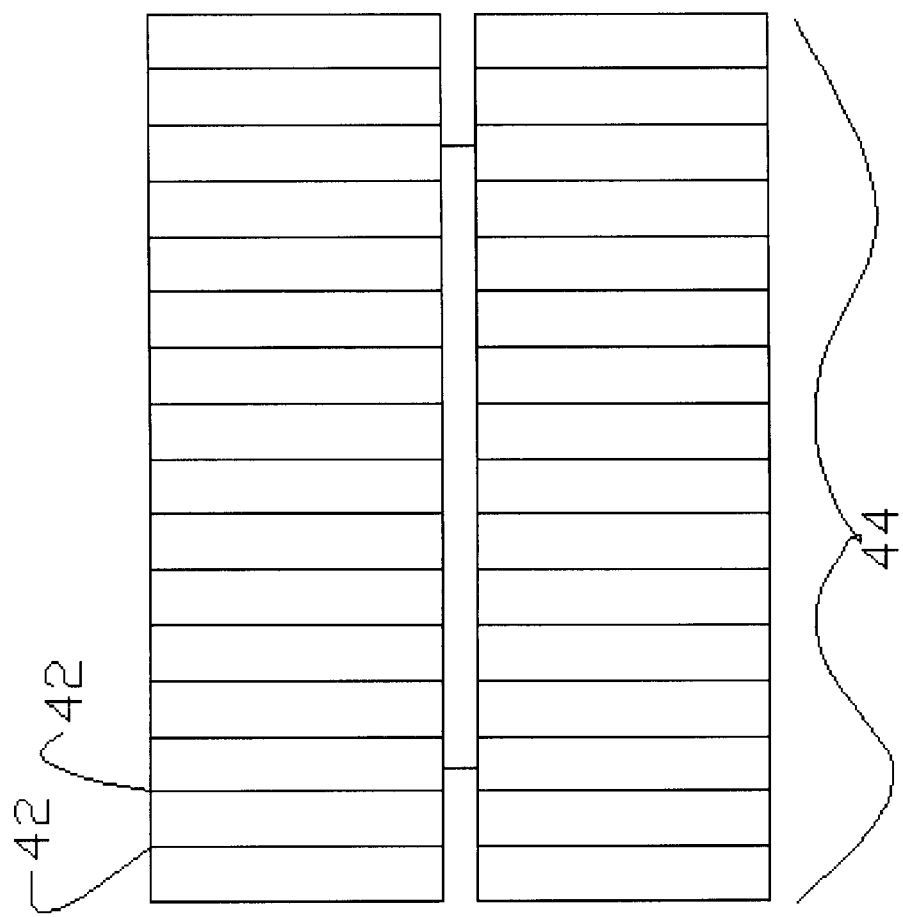
FIG. 4b illustrates a top view of a preferred embodiment of the heat exchanger of the present invention.

FIGS. 4a and 4b are an illustration of one example of the heat exchanger of the present invention. In FIGS. 4a and 4b, each of the fins 42 in the fin field 44 extends from the base 45 at an angle $\alpha$, ranging from 51° to 90°. The fin with the sharpest angle is the outermost fin 47, as shown in FIG. 4a. As the fins approach the center of the base 45, the central fin may have an angle of 90°. The length of each of the fins 42 vary according to the angle and positioning of the fin relative to the base 45 so that the effective height of each of the fins is uniform. In the illustrated heat exchanger 40 of FIGS. 4a and 4b, the effective height of the heat exchanger is 15 mm, with the length of the fins ranging from 19.3 mm to 15 mm in the center. The width of the base is 45 mm, however, the effective width of the heat exchanger with the increased wing span is 64 mm. In this particular example, the spacing between the adjacent fins in the fin field at the point where the fins attach or secure to the base is 2.0 mm. However, the spacing between adjacent fins at the top of the fin field is approximately 4.0 mm. As such, the spacing between the fins increases as the distance from the base to the top of the fin field increases. The spacing between the fins in FIGS. 4a and 4b is an example of the larger spacing between the fins in the field as compared to a conventional heat exchanger. The spacing between the fins along the base 45 ranges from about ten fins per inch to about forty fins per inch as laid out across the length of the base. As mentioned above, this spacing reduces premature egress of incoming fluid and thereby mitigating the amount of fluid flow exiting the fin field in an upward direction through the top region. Accordingly, the spacing between the fins 42 together with the angle $\alpha$ at which the fins are attached to the base 45 provides for the increased fan tail of the fin field so as to provide less resistance to the fluid flow through the fin field.

The configuration of the heat exchanger 40 illustrated in FIGS. 4a and 4b is one example of a heat exchanger with an increased fan tail exceeding the width of the base. The combination of the fan tail together with the fin density along the width of the base allows the heat exchanger to provide for smaller aspect ratios of individual channels between the fins as compared with the prior art and causes a smaller pressure drop to be generated across the heat exchanger. The smaller pressure drop across the heat exchanger 40 in FIGS. 4a and 4b increases the velocity of the fluid upstream of the entrance region. Accordingly, the increased fluid flow associated with the novel design together with the smaller pressure drop minimizes the fluid bypass commonly found in a conventional heat exchanger.

In addition to the novel design disclosed in FIG. 3, the invention also includes variations to the design which include means for further increasing the fluid flow under varying environmental conditions. Referring to FIGS. 5 through 19, specific alternative embodiments of the novel heat exchanger of the present invention are illustrated in light of the above-discussed principles. These embodiments depict various configurations of the mounting of an array of fins. The multiple configurations illustrated and discussed below each work to provide a heat exchanger comprising heat transfer of the fluid flow through the heat exchanger so as to minimize boundary layer formation, deter formation of high pressure, and reduce premature egress of fluid from the fin field. It is noted that each of the individual fin members disclosed in the various embodiments may be interchanged and varied to form an infinite number of configurations for a fan tail heat exchanger. Additionally, for purposes of simplicity some of the remaining drawing figures disclose features present on one half section of the heat exchanger being discussed. The illustrated heat exchanger actually incorporates the representative section onto the non-illustrated section of the heat exchanger in a mirror image layout. Furthermore, the scope of the invention should not be limited to the specific configuration of each heat exchanger illustrated in the attached drawing figures. Rather, the fins of each illustrated heat exchanger may be arranged and or combined with apertures, undulations, perpendicular channels, multiple fin lengths, secondary bases, wherein each configuration provides for a fan tail heat exchanger and the heat transfer benefits associated therewith. Accordingly, the heat exchangers illustrated in FIGS. 5 through 19 are best described as alternating half segments of a complete heat exchanger such that the half segment depicted in each figure can be combined with a similar half segment or any of the alternative half segments depicted in the other figures to compose a complete heat exchanger.

Furthermore, although the attached figures illustrate the base of the formed heat exchanger as being a horizontal planar surface, the base may be formed in a variety of shapes and positions. For example, the heat exchanger base may be circular in shape, thereby allowing the formed heat exchanger to be fitted around a circular object or fixture. Again, the non-planar shape of the heat exchanger should not be considered to be limited to a circular shape, rather the non-planar shape of the heat exchanger may be manufactured in a variety of shapes and sizes according to the desired result. Accordingly, both planar and non-planar heat exchangers may be formed in conjunction with the novel features described herein.

Figure 5:
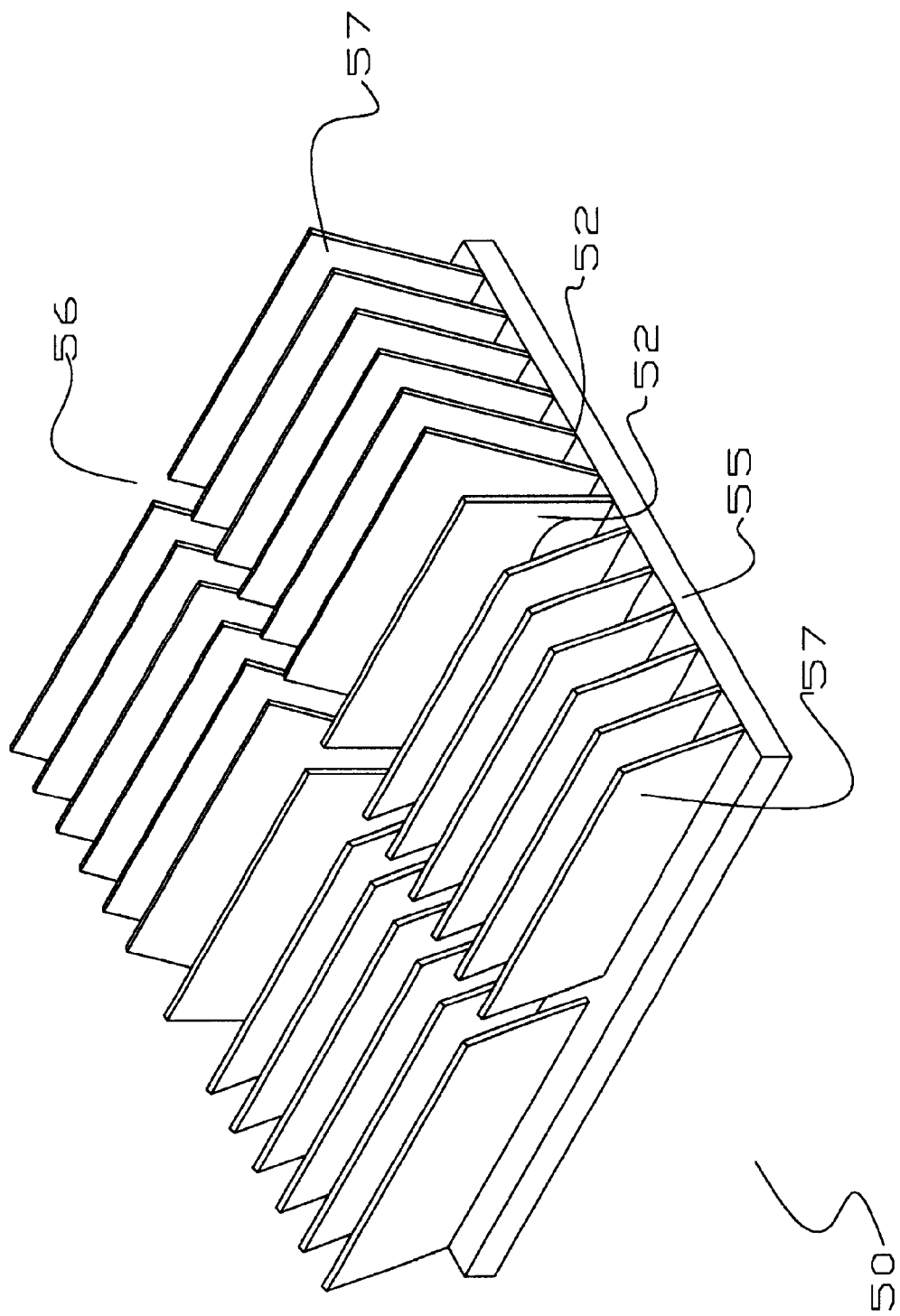
FIG. 5 illustrates a perspective view of an alternative embodiment of the heat exchanger of the present invention.

FIG. 5 is an illustration of a fan tail heat exchanger 50 comprising several distinct and novel modifications to the heat exchanger 30 of FIG. 3. In FIG. 5, the displacement of the fins in relation to the base may be equivalent to that of FIG. 3, however, the fins comprise an aperture 58 at approximately the midsection of each fin in the array. The apertures 58 in each fin align, so that they form a channel 56 perpendicular to the parallel channels between the adjacent fins. Such a channel 56 provides greater ease in mounting the heat exchanger 50 to a heat dissipating component. Accordingly, the channel 56 provides additional and alternative means of mounting a heat exchanger.

As shown in FIGS. 3 and 5, each fin has a uniform cross-sectional area along the entire length of the fin extending from the base to the top region. The point where the individual fins meet the base is a straight angle without any rounded corners, In addition, the heat exchanger 50 of FIG. 5 also comprises a set of end fins 57 having differing characteristics to the remaining fins 52 mounted on the base 55. The end fins 57 in this embodiment comprise a thickness significantly greater than the thickness of the fins therebetween. The thickness of the end fins may range from about 0.4 mm to about 1.0 mm. Among the benefits associated with end fins of this configuration is the ability of an individual or a mechanical apparatus to handle the heat exchanger with a reduced risk of damage. In general, the fins of the heat exchanger are relatively thin and are exposed to being damaged during handling as their resulting flexibility would allow for their distortion during handling. Accordingly, by providing end fins with a greater thickness and durability, the heat exchanger 50 is less fragile and more manageable.

The novel design of the heat exchanger 50 of FIG. 5 is not limited to the specific mounting structure of the fins 52 to the base 55 nor to the specific dimensions and sizings disclosed. Rather, this unique design of a fan tail heat exchanger 50, together with the perpendicular channel 56 and/or the increased thickness of the end fins 57 in comparison to the interior fins 52, may be combined with any of the novel heat exchangers disclosed herein to form a novel heat exchanger with the beneficial properties described herein.

Figure 6:
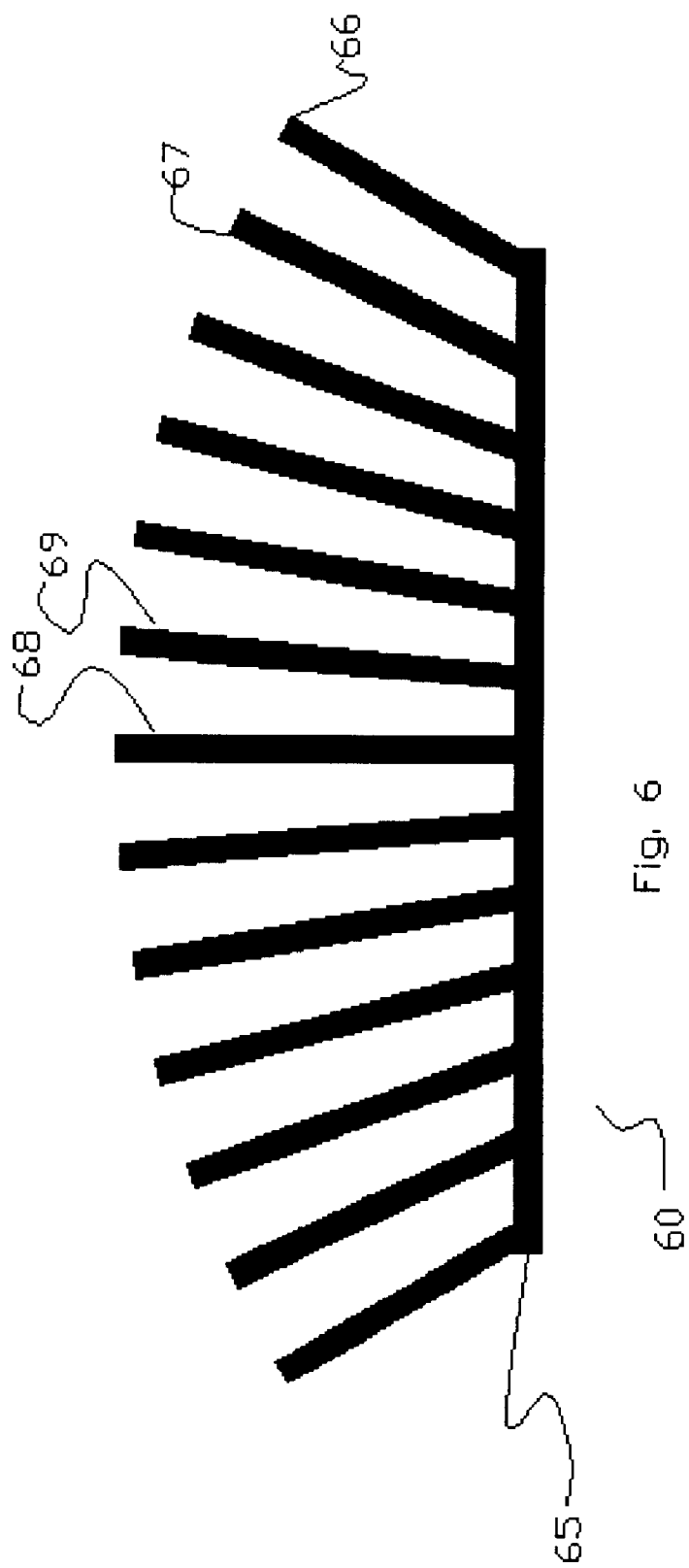
FIGS. 6 through 19 illustrates front views of the various embodiments of the heat exchanger of the present invention.

FIG. 6 illustrates a heat exchanger 60 comprising an array of plate fins mounted to the base 65 such that several of the interior plate fins 68 and 69 are mounted to the base at or near a 90 degree angle, and several of the exterior fins 66 and 67 are mounted to the base at an acute angle. The interior fins 68 and 69 comprises a uniform effective length, whereas the exterior fins 66 and 67 do not comprise a uniform effective length. As shown in FIG. 6, the length of the exterior fins 66 and 67 decrease as they extend toward the edge of the base 65. Due to the mounting of the exterior fins 66 and 67, the heat exchanger 60 of this configuration comprises the fan tail characteristics. Among the benefits associated with this configuration is a high fin density for low to moderate fluid flow. The exterior fins 66 and 67 adjacent to an exterior edge of the base 65 are shorter than the interior fins 68 and 69 and function to guide the fluid flow closer to the component edge. Accordingly the design of this embodiment provides for a fin assembly for reducing or minimizing flow dispersion from the vicinity of the heat exchanger.

Figure 7:
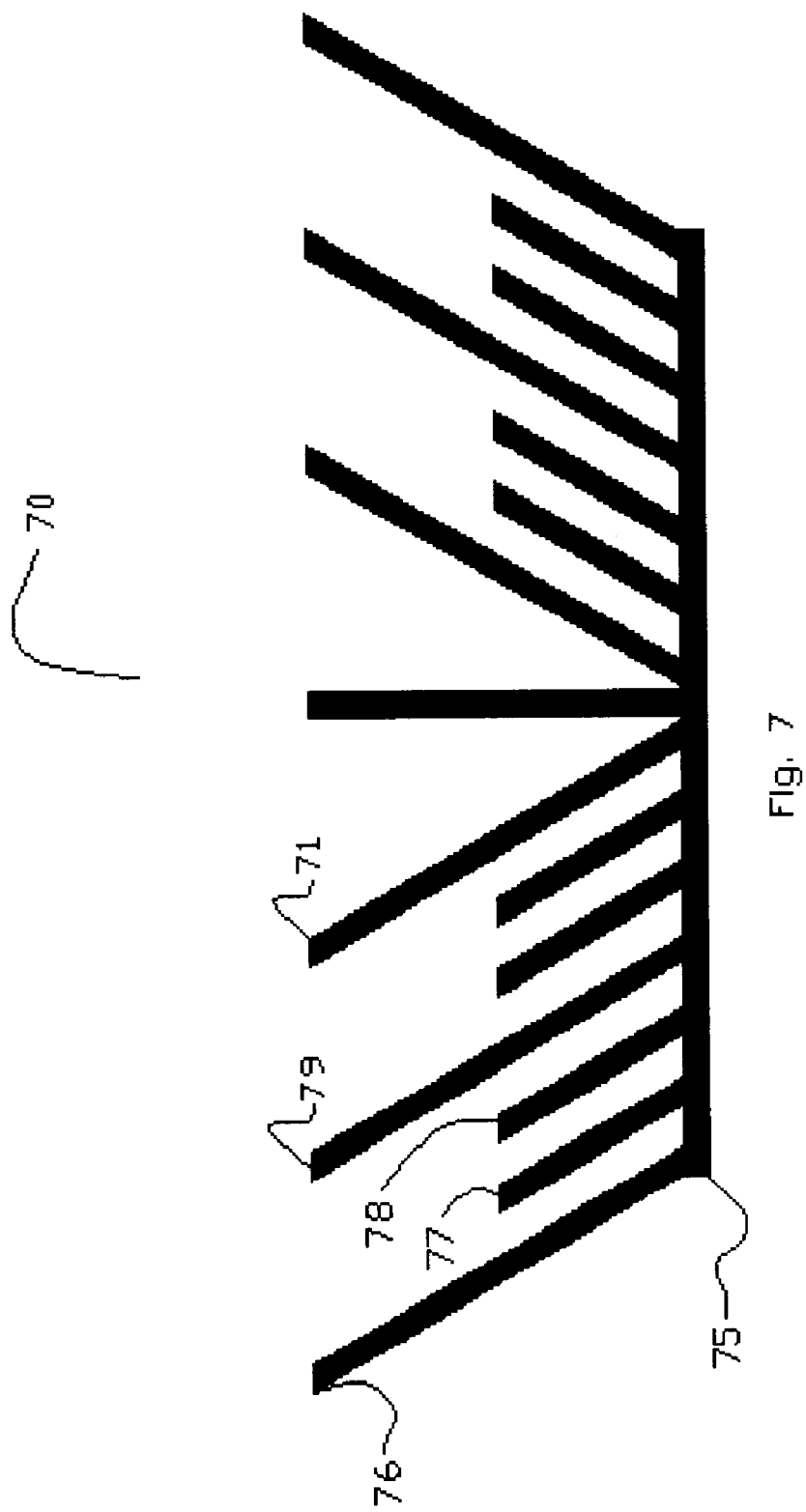

FIG. 7 illustrates a heat exchanger 70 comprising an array of plate fins being mounted to the base 75 such that the relationship of the angles of the exterior fins to the base 75 is uniform, but the effective length of the exterior fins are not uniform. As clearly illustrated, the end fin 76 is approximately twice the length of the adjacent fin 77. The length of the third fin 78 is equivalent to the length of the second fin, however, the length of the fourth fin 79 is equivalent to the length of the first fin 76. As such, the fins are mounted to the base in a specific pattern within a fan tail configuration. This particular design is beneficial for natural convection fluid flows. The end fin 76 together with the fourth and seventh fins, 79 and 71 respectively, essentially create the channeled fluid flow, while providing the required fluid flow for the short fins 77 and 78 that function to dissipate the heat from the heat generating component.

Figure 8:
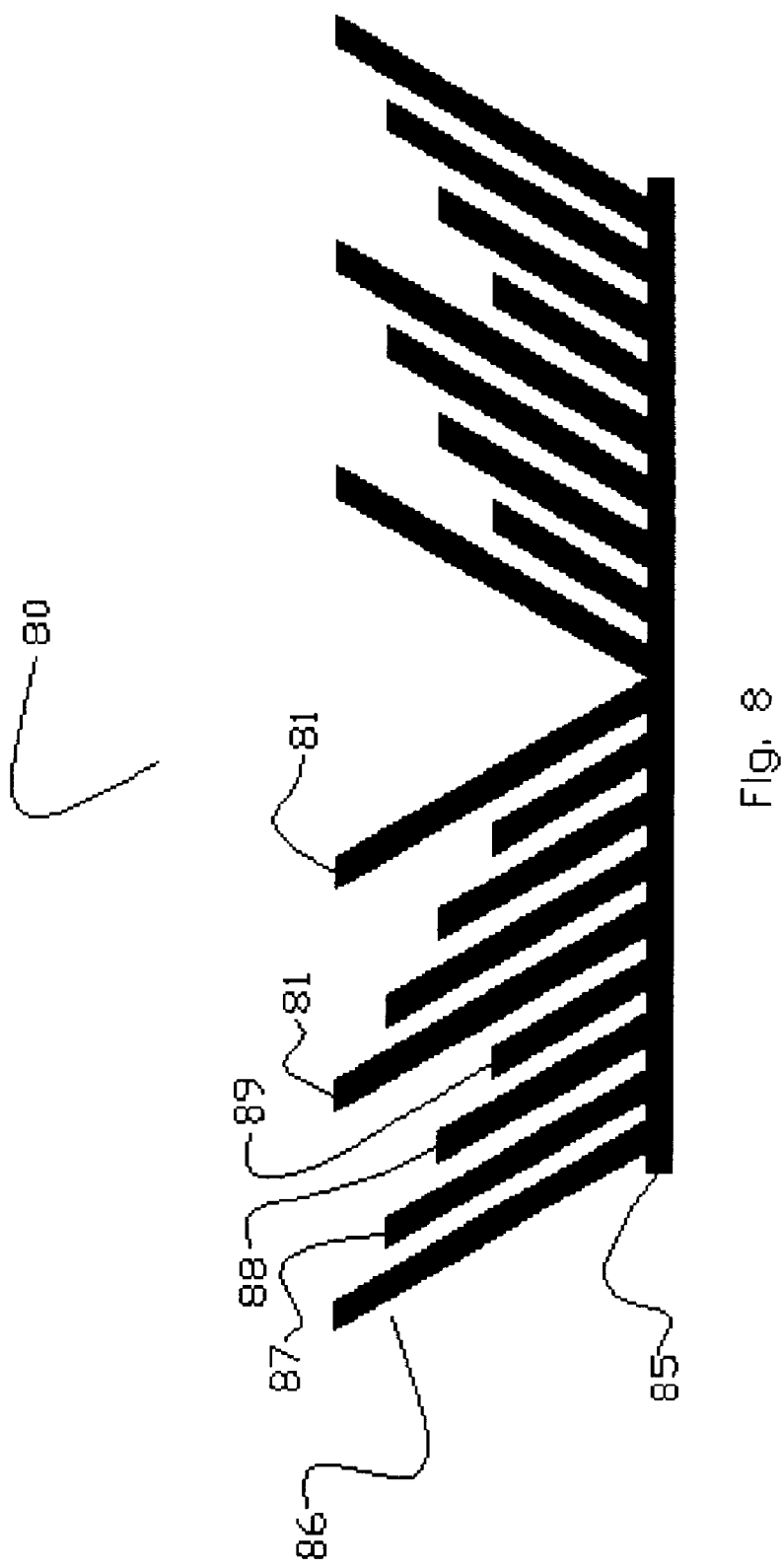

FIG. 8 illustrates a heat exchanger 80 comprising an array of plate fins mounted to the base 85 such that the relationship of the angles of the exterior fins to the base 85 is uniform, but the length of the fins are not uniform. As clearly illustrated, the fins are mounted in sets of four, where the end fin 86 is the longest, and the length of the next three fins 87, 88, and 89 are successively shorter. The sets of fins are mounted to the base 85 in a pattern which repeats along the length of the base. Similar to the design disclosed in FIG. 7, this particular design is ideal for natural convection fluid flows. The end fins 86 together with the other long length fins 81 essentially create the channeled fluid flow, while providing the required fluid flow for the successively shorter fins 87, 88 and 89 that function to increase heat dissipation from the heat generating component. Accordingly, the relation between the height of the fins 86, 87, 88 and 89 function to enhance heat transfer.

Figure 9:
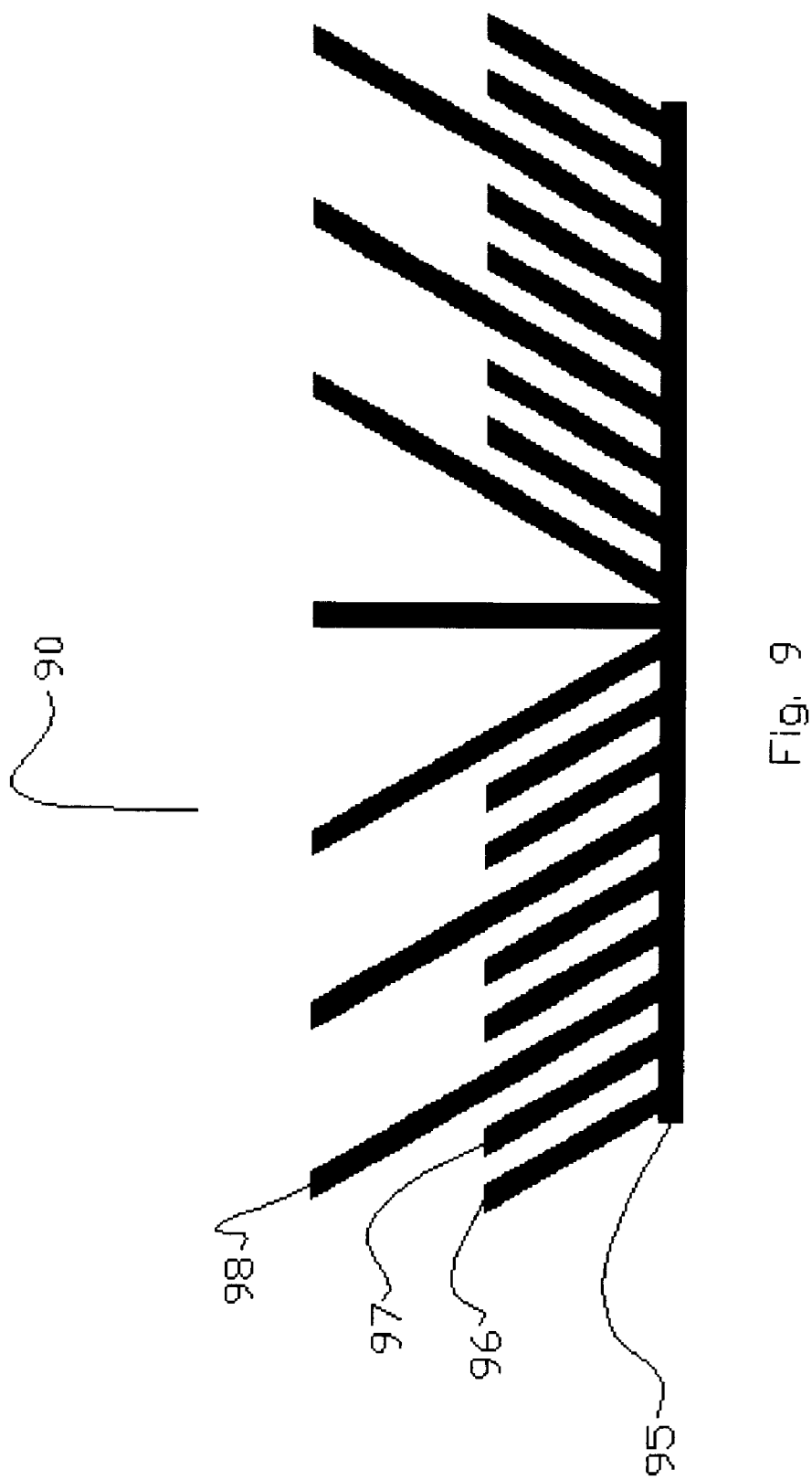

FIG. 9 is an illustration of a heat exchanger 90 comprising a reverse layout design from that of the heat exchanger 70 disclosed in FIG. 7. In FIG. 9, an array of plate fins are mounted to a base 95 where the relationship of the angles of the exterior fins to the base 95 is uniform, but the effective length of the fins are not uniform. The two exterior most fins 96 and 97 are short followed by a tall fin 98, and then the pattern and layout of the fins repeat. This particular design provides a similar function to the heat exchanger 70 of FIG. 7. The exterior fins 96 and 97 help minimize flow dispersion around the heat sink and also provide a higher speed fluid flow through the exhaust end of the heat exchanger 90. Again, the combination of the short fins 96 and 97 together with the tall fins 98 makes the heat exchanger ideal for natural convection fluid flow. The tall fins 98 create the channeled fluid flow thereby providing the required fluid flow for the shorter fins 96 and 97 for heat dissipation. Accordingly, the configuration of FIG. 9 provides a channeled fluid flow while minimizing flow dispersion around the heat exchanger and providing higher velocity fluid flow at the exhaust region.

Figure 10:
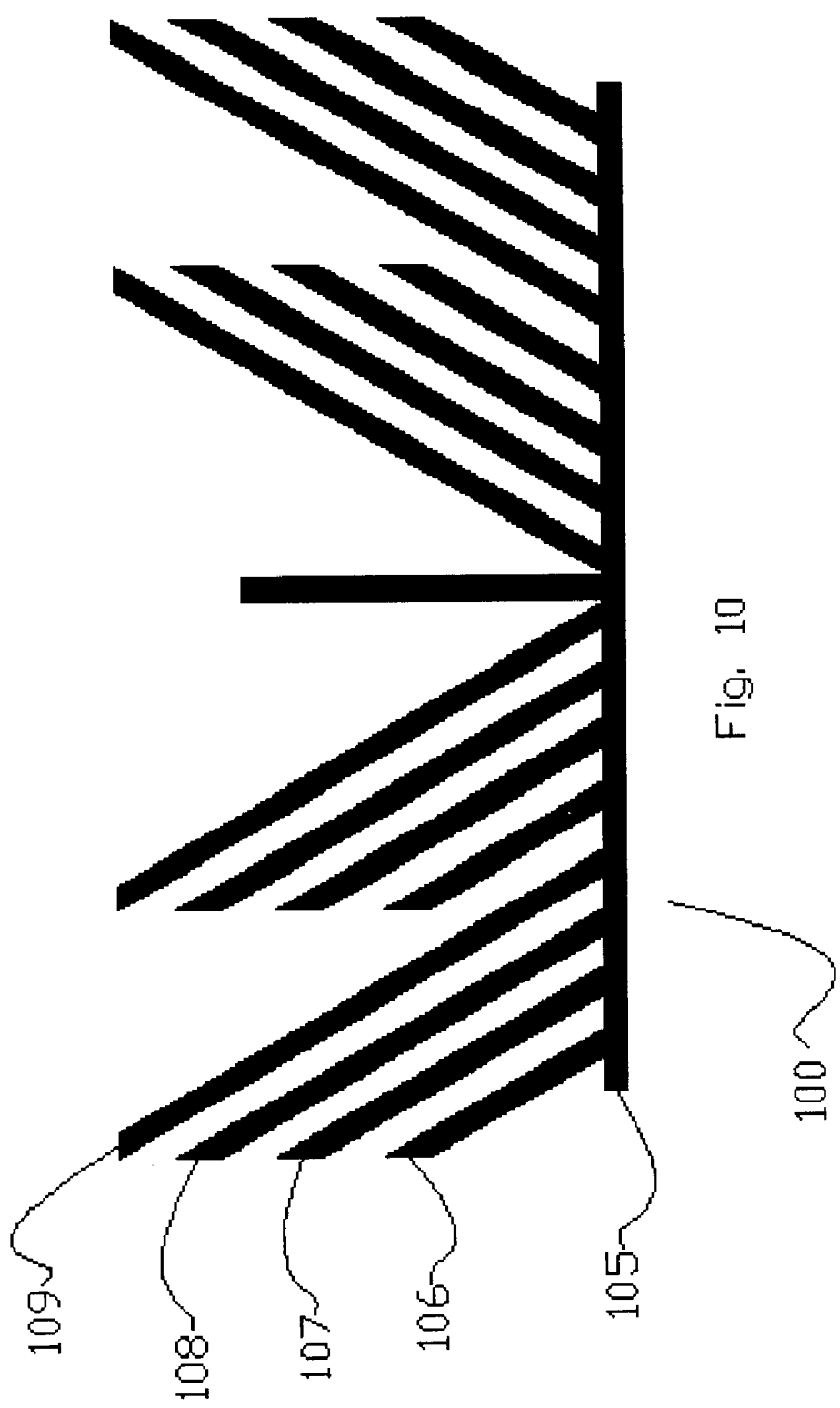

FIG. 10 is an illustration of a heat exchanger 100 comprising an inverse fin configuration of the heat exchanger 80 disclosed in FIG. 8. In FIG. 100, the shortest fin 106 is mounted at the outermost portion of the base 105. The fins increase in length along the base 105 towards the interior portion of the base, until the pattern of the fin configuration repeats. The shorter fins 106, 107 and 108 mounted along the exterior portion of the base 105 provide a minimized fluid flow dispersion and a higher velocity fluid flow at the exhaust region of the heat exchanger 100. Accordingly, the design of this heat exchanger 100 is beneficial where higher velocity fluid flows are desirable.

Figure 11:
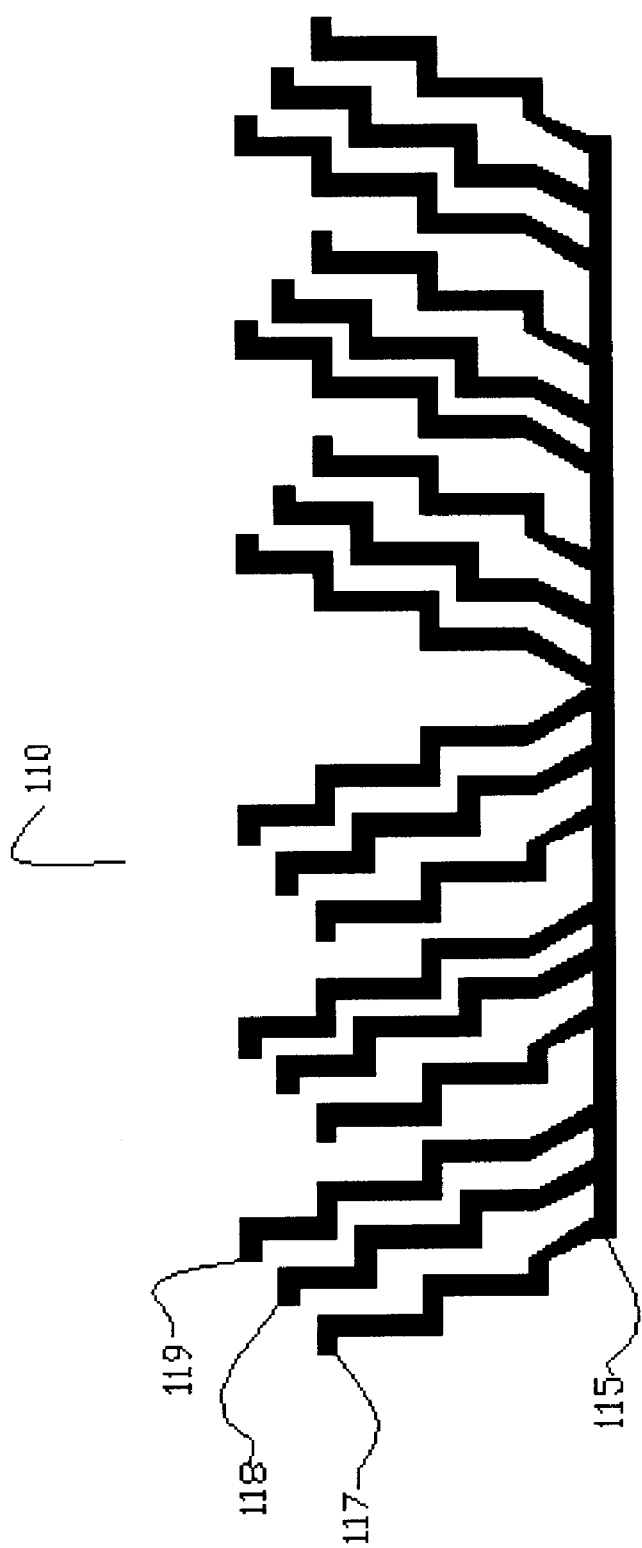

FIG. 11 discloses a heat exchanger 110 of the present invention comprising communication, ventilation and fluid control means together with the fan tail exceeding that of the width of the base 115. In FIG. 11, the fins 117, 118 and 119 are not flat, rather they comprise undulations along the length of the fin. Although the surface modifications in FIG. 11 are in the form of undulations, the surface modifications may also include notches, apertures, slots, flow guides and comparable design features. Such surface modifications provide a means for increasing the surface area of the fins in the heat exchanger while also providing an increase fan tail for the heat exchanger as a whole. In addition, the surface modifications provide for enhanced heat transfer by reducing the boundary layer and managing the flow distribution in the fin field. Accordingly, the combination of surface modifications on the individual fins 117, 118 and 119 together with the fan tail design results in a heat exchanger with a lower thermal resistance.

Figure 12:
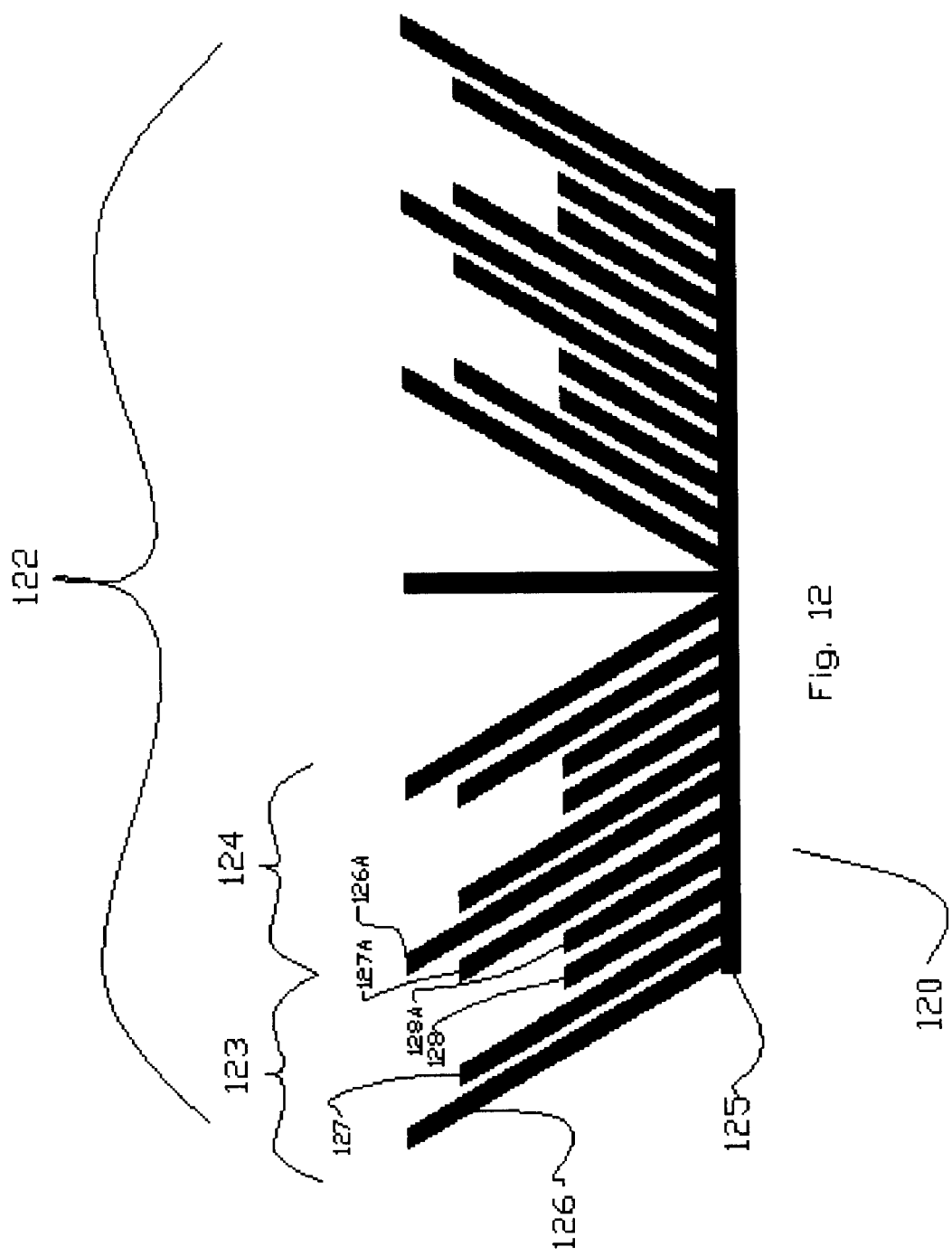

FIG. 12 discloses a heat exchanger 120 of the present invention comprising a mounted fin field 122 similar to the heat exchanger 70 of FIG. 7. The exterior fin 126 is the longest fin in the fin field and, as the fins progress toward the midsection of the heat exchanger 120, they decrease in height sequentially in sets of three. As such, the fin 127 adjacent to the exterior fin 126 has a medium height and is shorter than the exterior fin 126, while the next sequential fin 128 is the shortest in height among the fins mounted to the base. Adjacent to the shortest fin 128 is another set of fins 128*a*, 127*a* and 126*a* arranged in a mirror image to the first three fins 126, 127 and 128. As such, the pattern of fins repeat once toward the midsection of the base 125. The secondary set of fins 124 adjacent to the midsection of the base 125 provide for a higher velocity flow as compared to the primary set of fins 123 adjacent to the exterior edge of the base 125. Accordingly, the configuration of the fins in relation to their lengths makes this heat exchanger 120 desirable in instances where low velocity fluid flows are sought.

Figure 13:
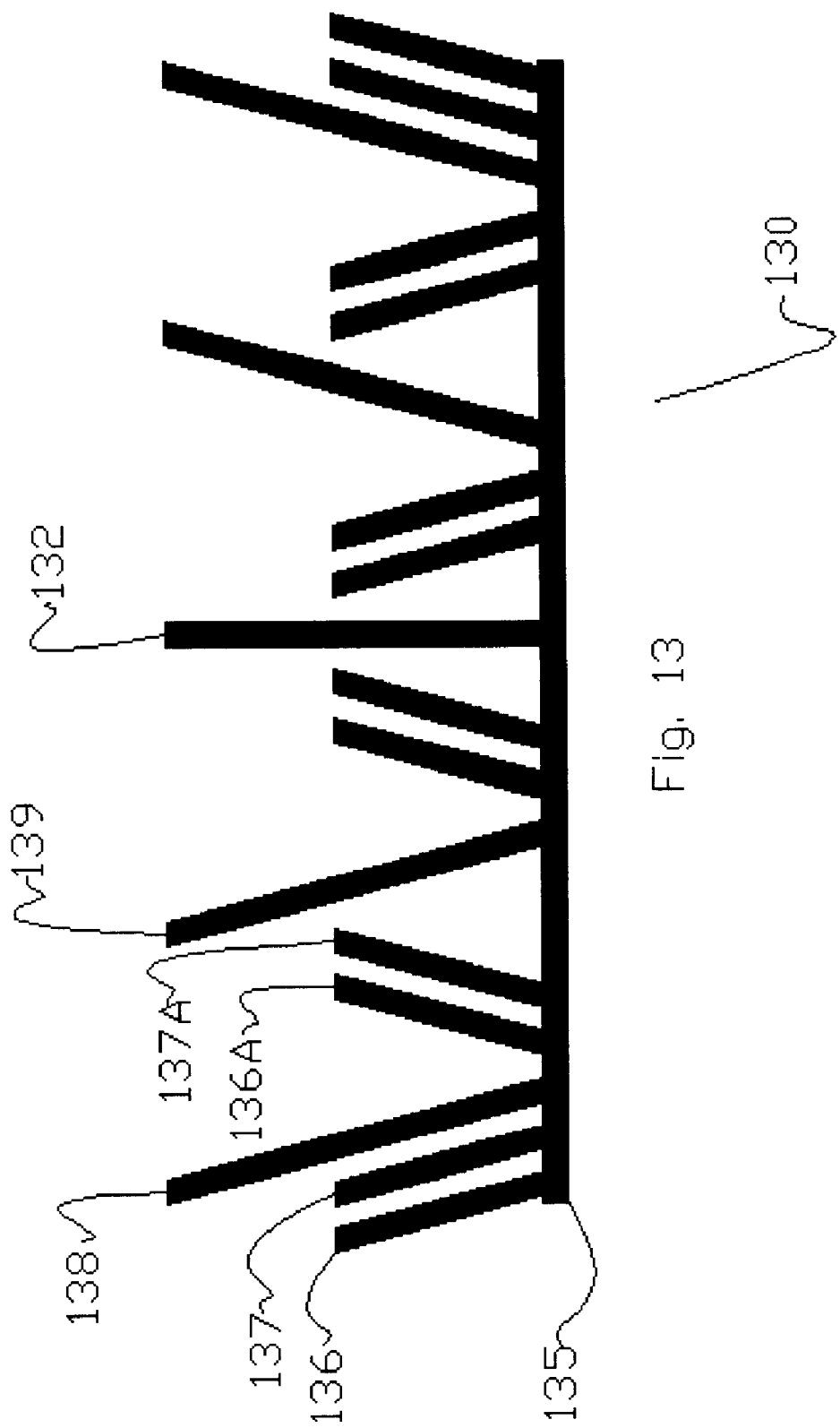

FIG. 13 discloses a heat exchanger 130 of the present invention comprising a plurality of fins mounted to the base 135 at a mixture of angles. As illustrated in FIG. 130, the first fin 136, the second fin 137 , and the third fin 138 each extend angularly toward the exterior portion of the base 135. The displacement of the fins 136, 137 and 138 provide the fan tail configuration for the heat exchanger 130. The first two fins 136 and 137 are short in length and the third fin 138 is tall. It should be noted that the fin configuration of the remaining portions of the first section of the heat exchanger 130 do not repeat in an identical manner as in the previous illustrations of the various embodiments present. Rather, as illustrated in FIG. 13, the sequential fins 136*a* and 137*a*, adjacent to the third fin 138, are short in length, similar to the first and second fins 136 and 137 respectively, however the sequential fins extend at an acute angle toward the center of the heat exchanger 130. The following fin 139 is a tall fin, similar if not equal in length to the third fin 138. The tall fin 139 extends at an acute angle toward the exterior portion of the heat exchanger 130. Each of the tall fins present 138 and 139 in this embodiment, with exception of the central fin 132, extend toward the exterior portion of the heat exchanger similar to the first, second, and third fins 136, 137 and 138. Among the benefits associated with this fin field layout is that the short sets of fins mounted at opposite angles assist in breaking the boundary layer and the subsequent stagnation points in the aggregate fin field adjacent to the base 135. Accordingly, the heat exchanger of FIG. 13 provides a lower thermal resistance than prior art heat exchangers.

Figure 14:
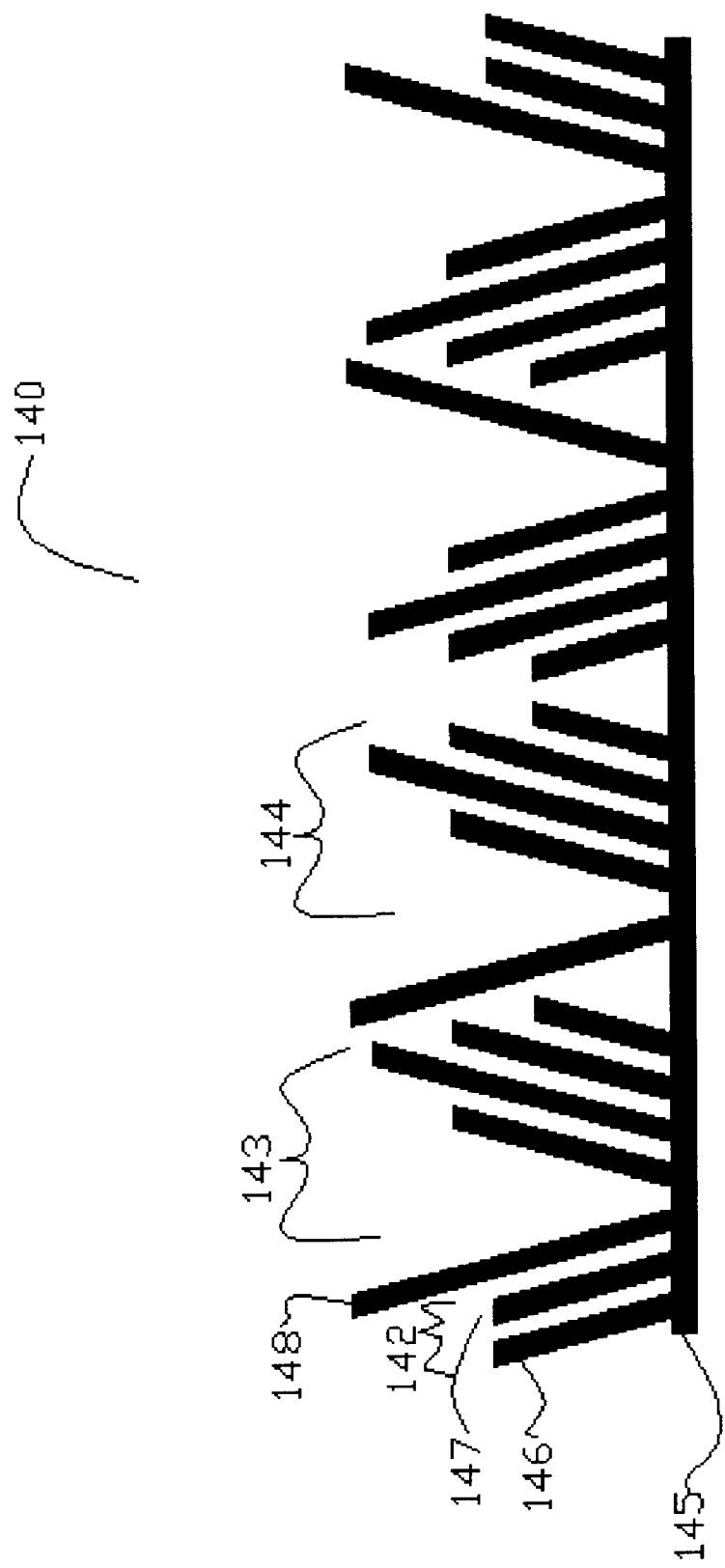

The heat exchanger 140 illustrated in FIG. 14 is a modification to the heat exchanger 130 of FIG. 13. As illustrated in FIG. 14, the fin field of this heat exchanger 140 comprises two significant modifications, first the fin field density is increased and second the shorter set of fins 142, 143 and 144 comprise varying lengths. The first and second fins 146 and 147 are nearly identical in length and extend angularly toward the exterior portion of the base 145. The third fin 148 is long, and similar to the first two fins, 146 and 147, extends at a similar angle toward the exterior portion of the base 145. Each of the tall fins present in this embodiment extend angularly toward the exterior portion of the heat exchanger, similar to the first two fins 146 and 147. However, the short interior set of fins 143 and 144 extend at an acute angle toward the center of the fin, in a direction opposite to the first two fins 146 and 147, as well as the tall fins 148. Accordingly, the heat exchanger 140 of FIG. 14 enhances the fluid flow and manages the flow distribution in the fin field while providing a reduced thermal resistance.

Figure 15:
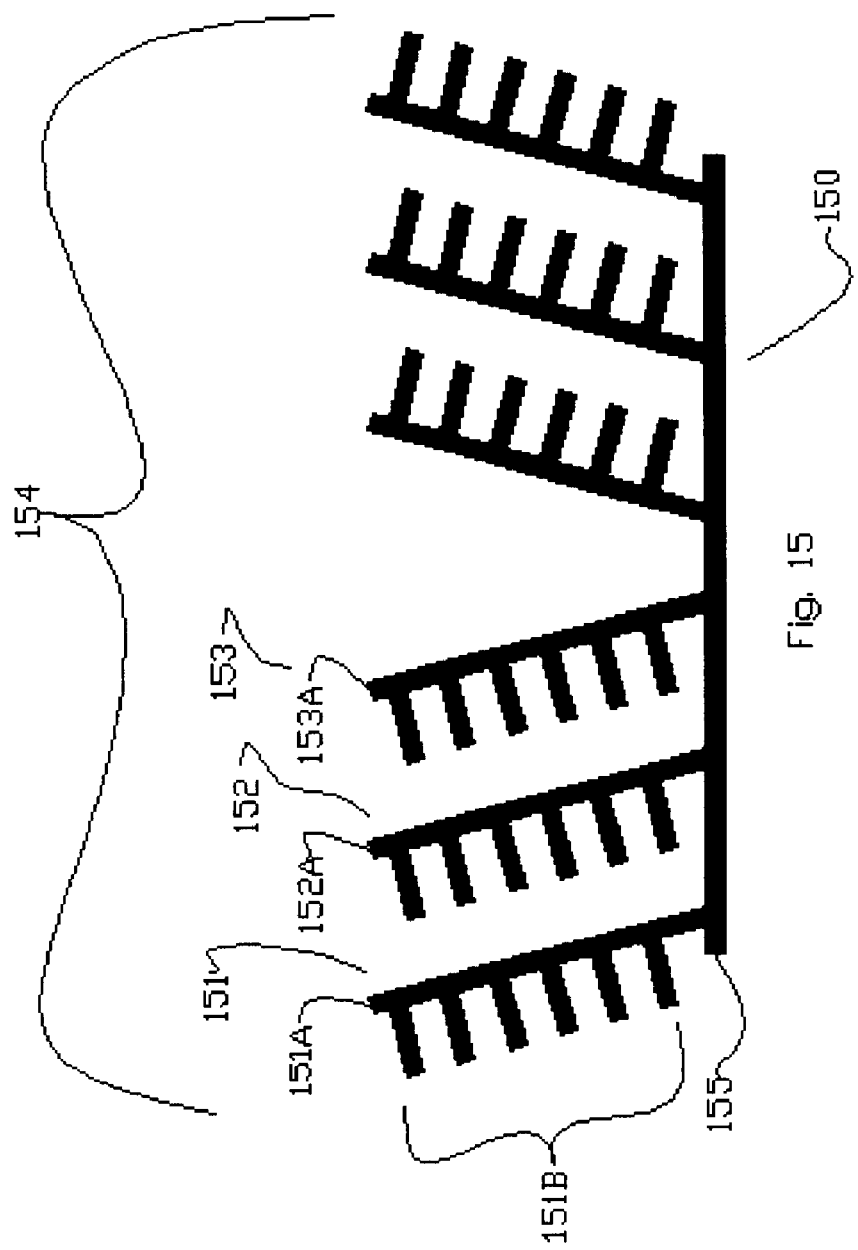
Figure 16:
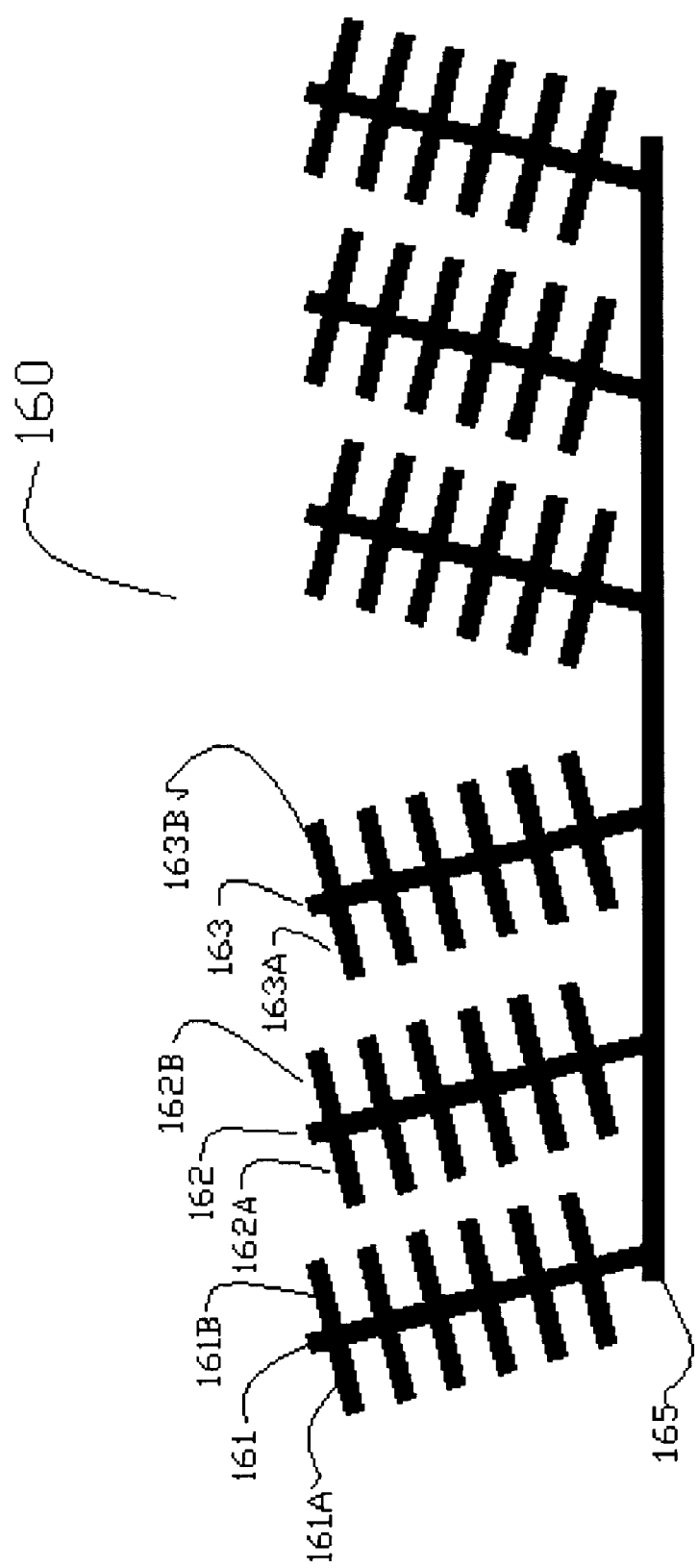

FIG. 15 discloses a heat exchanger 150 of the present invention comprising a plurality of secondary heat exchangers 151, 152 and 153 mounted within the heat exchanger 150. As illustrated, the heat exchanger 150 comprises a primary base 155 and a primary fin field 154. However, within the primary fin field 154, the heat exchanger comprises a set of secondary bases 151*a*, 152*a* and 153*a* mounted to the primary base 155. The thickness of the individual secondary bases may range from about 0.5 mm to about 1.5 mm. In a preferred embodiment, the secondary bases 151*a*, 152*a* and 153*a* are mounted orthogonally to the primary base. However, in an alternative embodiment, the secondary bases 151*a*, 152*a*, 153*a* may be mounted to the primary base at any angle, so long as the primary and secondary bases remain in thermal communication. In addition, the secondary bases should not be limited to the structure disclosed in the referenced drawing figures, rather the secondary base may be circular in shape or may comprises a variety of non-planar shapes. The secondary bases 151*a*, 152*a* and 153*a* each have a secondary fin field 151*b* mounted orthogonal or angled therefrom. In a further embodiment, as illustrated in FIG. 16, the secondary bases 161, 162 and 163 may have two sets of fin fields 161*a* and 162*b*, 162*a* and 162*b*, and 163*a* and 163*b* extending outwardly from both sides of the secondary bases 161, 162 and 163. In general, the secondary bases of both FIGS. 15 and 16 function to transfer a large portion of the heat from the primary bases 155 and 165. The secondary fin fields work with the secondary bases and provide extended surfaces for dissipating heat within the heat exchanger. Based upon the configuration of the heat exchangers 150 and 160, the secondary fin fields are offset mounted from the primary bases 155 and 165 and as such reside in a cooler fluid environment than a conventional fin field heat exchanger wherein the fin field is mounted adjacent to the primary base. Accordingly, the heat exchanger enhances heat transfer of cooler fluid adjacent to the top of the fin field, wherein the net effect of utilizing the heat exchanger is a net increase in the rate of thermal reduction.

Figure 17:
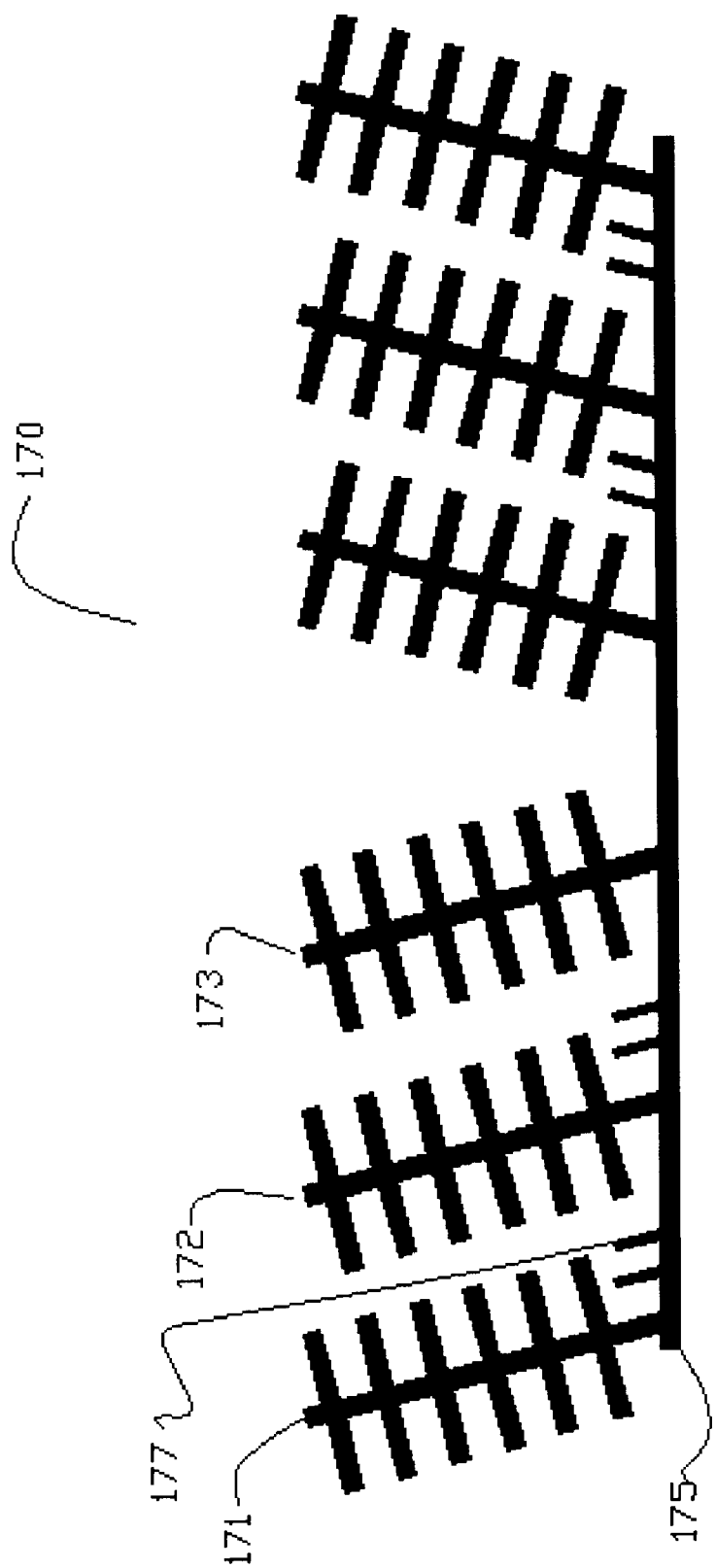

FIG. 17 is an illustration of a heat exchanger 170 comprising an alternative embodiment to the heat exchangers 150 and 160 of FIGS. 15 and 16. The heat exchanger 170 comprises a set of fins 177 mounted to the primary base 175 between the set of secondary bases 171, 172 and 173. The fins 177 provide a higher performance heat exchanger and a means for enhancing heat transfer between the hotter fluid adjacent to the primary base 175 and the cooler fluid lying at the top of the fin field.

Figure 18:
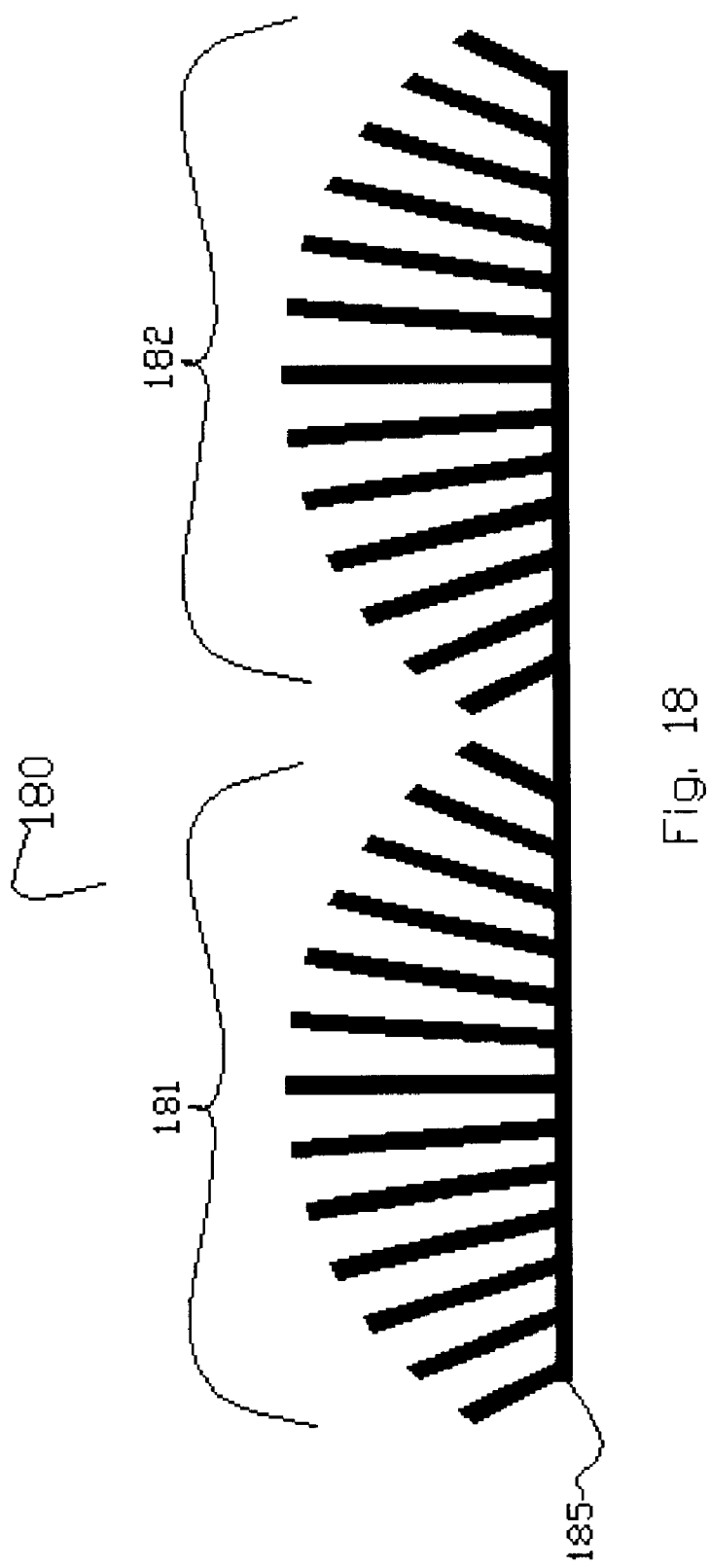

FIG. 18 is an illustration of a heat exchanger 180 essentially comprising two primary sets of fin fields 181 and 182 having a fan tail. The heat exchanger 180 combines the heat exchanger 60 of FIG. 6 and repeats the pattern along the base 185. The pattern may be repeated two or three times depending upon the length of the base and the fin density. Among the benefits associated with this heat exchanger 180 is that it creates significantly higher fluid velocity at the center of the fin field where the heat source tends to be concentrated.

Figure 19:
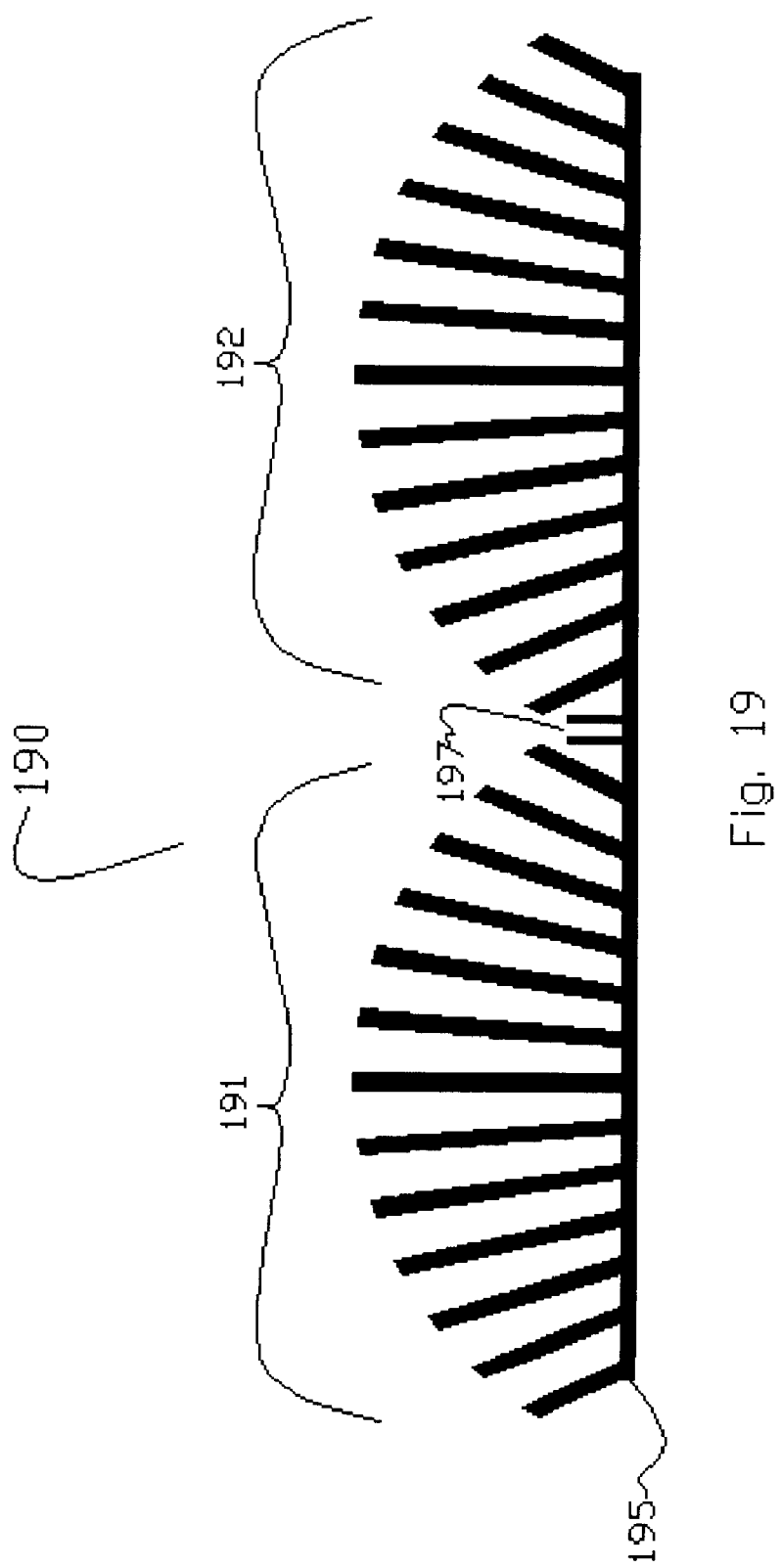

In an alternative embodiment, as illustrated in FIG. 19, the fin field comprises a set of secondary fins 197 mounted perpendicular to the base between the two primary fin fields 191 and 192, respectively. The secondary set of fins 197 increases the performance of the heat exchanger 190 and provides for a greater heat transfer between the hotter fluid adjacent to the base 195 and the cooler fluid located at an area adjacent to the top of the fin field. The scope of the heat exchange of this embodiment should not be limited to the drawing figure illustrated. The secondary fin field 197 may vary in density depending upon the desired level of performance. Accordingly, the primary embodiments of the heat exchanger 190 of FIG. 19 disclose the combination of the plurality of primary fan tail fin fields together with a secondary fin field mounted there between for enhancing performance of the heat exchanger 190.

The above description is of a novel heat exchanger and method for improving the flow of fluid and heat transfer of fluid adjacent to a heat generating component. Although the present invention has been described in connection with preferred embodiments thereof, it will be appreciated by those skilled in the art that additions, deletions, modifications, and substitutions not specifically described may be made without departing from the spirit and scope of the invention as defined in the appended claims and the scope should not be limited to the dimensions indicated herein above.

What is claimed:

1. A heat exchanger, comprising:
    a thermally conductive base in thermal communication with a component, said base providing a substantially planar region;
    a plurality of thermally conductive plate fins affixed to said base with substantially uniform spacing between adjacent fins across said base;
    said fins define a fin field with a top region and a bottom region;
    said bottom region of said fin field is adjacent to said base;
    said top region of said fin field having a width greater than said bottom region of said fin field;
    said plate fins having a uniform cross-sectional area extending from the base to the top region; and
    said top region of said fin field comprises a flat planar surface parallel to the base such that each fin in the fin field extends from the base to the top region.

2. The heat exchanger of claim 1, wherein said fin field has a density range from about 10 fins per inch to about 60 fins per inch.

3. The heat exchanger of claim 1, wherein the width of the fin field has a range from about 45 mm to about 64 mm.

4. The heat exchanger of claim 1, wherein the length of the fins range from about 15 mm to about 19.3 mm.

5. The heat exchanger of claim 1, wherein the angle of the fins to the base range from about 51 degrees to about 90 degrees.

6. The heat exchanger of claim 1, wherein said fins further comprise an aperture along a common portion such that the apertures form a secondary channel perpendicular to the channels of the fin field.

7. The heat exchanger of claim 1, wherein a set of end fins have a thickness between 0.4 mm and 1.0 mm.

8. The heat exchanger of claim 1, further comprises a straight angle where said fins meet said base.

9. A heat exchanger comprising:
    a thermally conductive base in thermal communication with said component, said base providing a substantially planar region;
    a plurality of thermally conductive plate fins affixed to said base in a spaced relationship with substantially uniform spacing between adjacent fins across said base;
    each of said fins having a top and a bottom;
    said bottom of said fins is affixed to said base at a straight angle;
    said fins define a fin field with a top region and a bottom region;
    a width of the fin field adjacent to the top region is greater than a width of the fin field adjacent to the base;
    said plate fins having a uniform cross-sectional area extending from the base to the top region; and
    said top region of said fin field having a flat planar surface area parallel to the base such that all of said fins in the fin field extend from the base to the top region.

10. The heat exchanger of claim 9, wherein said fin field has a density range from about 10 fins per inch to about 60 fins per inch.

11. The heat exchanger of claim 9, wherein the width of the fin field has a range from about 45 mm to about 64 mm.

12. The heat exchanger of claim 9, wherein the length of the fins range from about 15 mm to about 19.3 mm.

13. The heat exchanger of claim 9, wherein the angle of the fins to the base range from about 51 degrees to about 90 degrees.

14. The heat exchanger of claim 9, wherein said fins further comprise an aperture along a common portion such that the apertures form a secondary channel perpendicular to the channels of the tin field.

15. The heat exchanger of claim 9, wherein a set of end fins have a thickness between 0.4 mm and 1.0 mm.

* * * * *